United States Patent
Kondoh

(10) Patent No.: US 8,729,569 B2
(45) Date of Patent: May 20, 2014

(54) LIGHT-EMITTING CHIP, PRINT HEAD AND IMAGE FORMING APPARATUS

(75) Inventor: Yoshinao Kondoh, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 403 days.

(21) Appl. No.: 12/726,679

(22) Filed: Mar. 18, 2010

(65) Prior Publication Data

US 2011/0063400 A1    Mar. 17, 2011

(30) Foreign Application Priority Data

Sep. 16, 2009   (JP) ................... 2009-214951

(51) Int. Cl.
- H01L 29/18   (2006.01)
- B41J 2/435   (2006.01)
- H01L 27/15   (2006.01)

(52) U.S. Cl.
USPC ............................. 257/88; 347/237; 347/82

(58) Field of Classification Search
USPC ...................... 347/237; 257/82, 88
See application file for complete search history.

(56) References Cited

U.S. PATENT DOCUMENTS

| | | | | |
|---|---|---|---|---|
| 5,177,405 A | * | 1/1993 | Kusuda et al. | 315/169.1 |
| 6,507,057 B1 | | 1/2003 | Ohno | |
| 7,518,152 B2 | * | 4/2009 | Ohno | 257/82 |
| 2005/0087748 A1 | * | 4/2005 | Ohno | 257/88 |
| 2010/0047947 A1 | * | 2/2010 | Yashima et al. | 438/40 |

FOREIGN PATENT DOCUMENTS

| | | |
|---|---|---|
| JP | 2001-094153 | 4/2001 |
| JP | 2004-128175 | 4/2004 |
| JP | 2007-250961 | 9/2007 |

* cited by examiner

*Primary Examiner* — Sarah Al Hashimi
(74) *Attorney, Agent, or Firm* — Fildes & Outland, P.C.

(57) ABSTRACT

The light-emitting chip includes: a substrate; plural light-emitting thyristors each having a pnpn structure formed of a first stacked-semiconductor layer in which at least 4 semiconductor layers having different conductivity types and including the substrate are stacked on the substrate; a lower wiring that is formed of a second stacked-semiconductor layer in which at least 3 semiconductor layers having different conductivity types and including the substrate are stacked on the substrate, and that has a semiconductor layer between the substrate and an uppermost semiconductor layer of the second stacked-semiconductor layer, the semiconductor layer having a fixed potential so that any one of p-n junctions between the substrate and the uppermost semiconductor layer is reversely biased with respect to potentials respectively applied to the substrate and the uppermost semiconductor layer; and an upper wiring provided on the lower wiring so as to intersect with the lower wiring through an isolation layer.

7 Claims, 13 Drawing Sheets

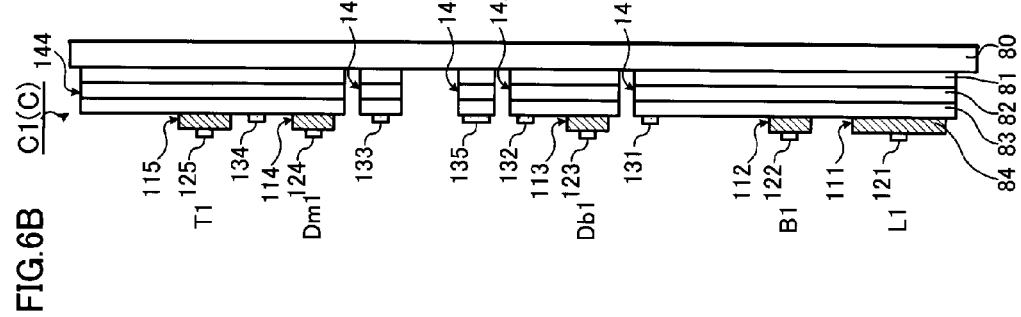
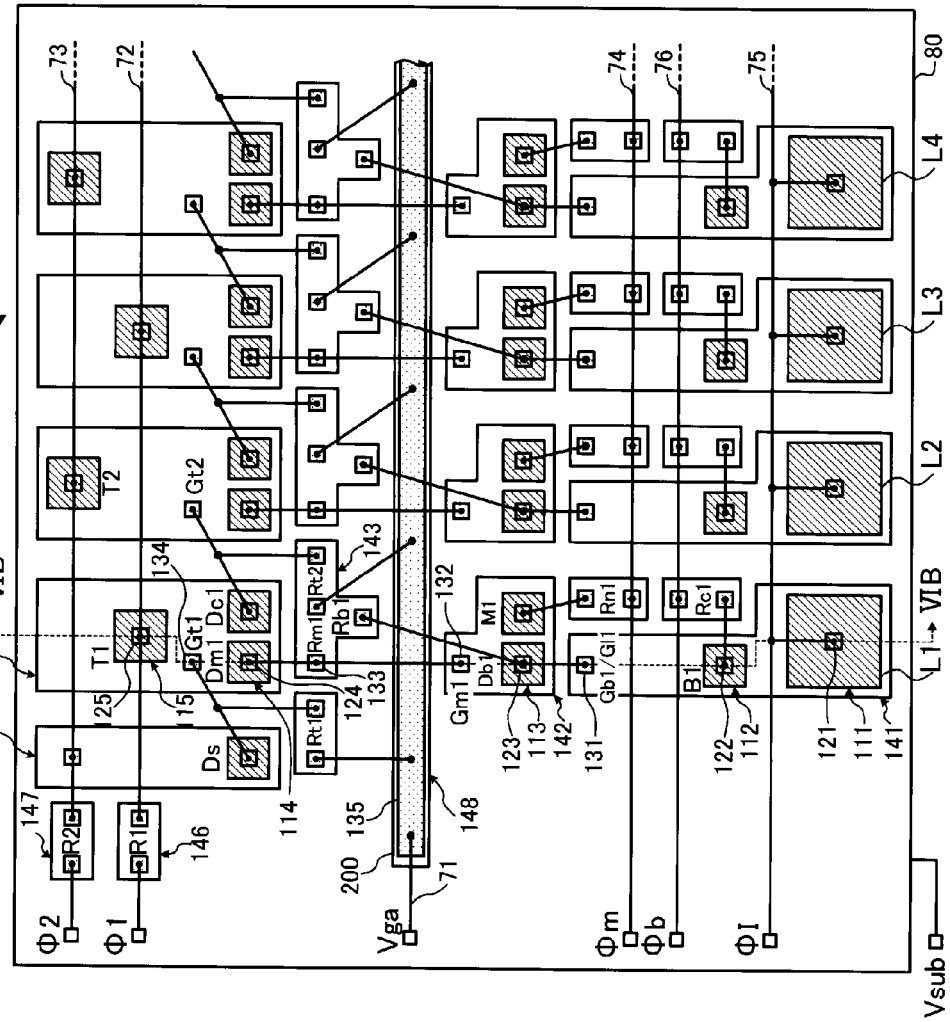
FIG.6A
FIG.6B

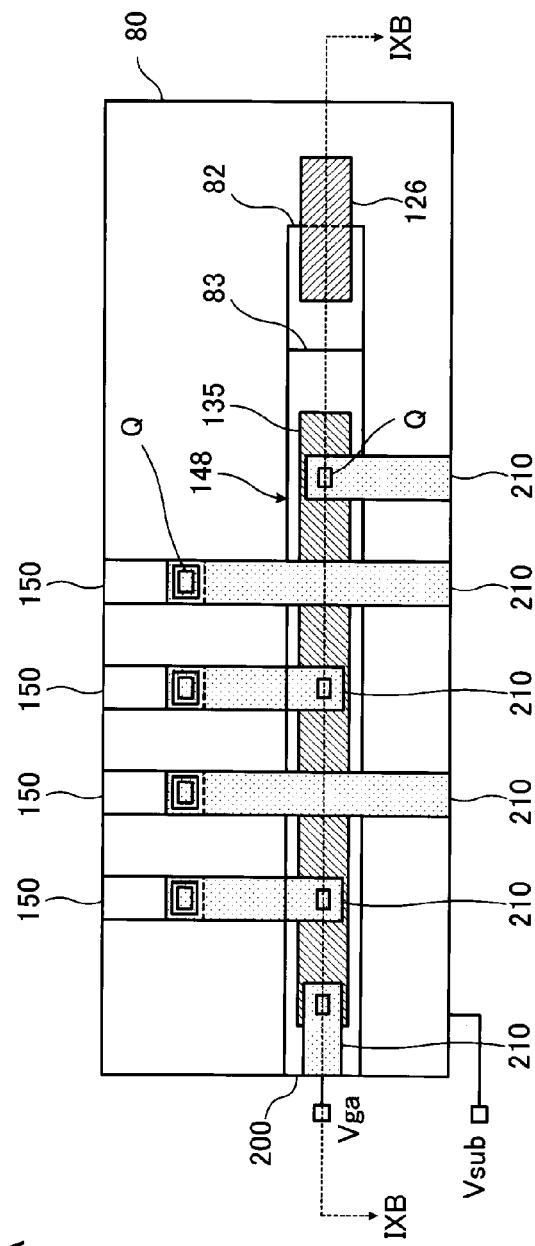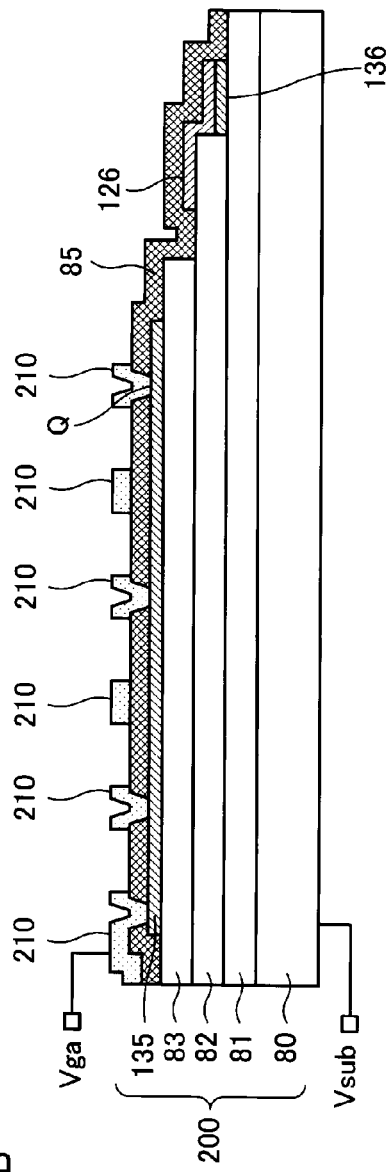
FIG.9A
FIG.9B

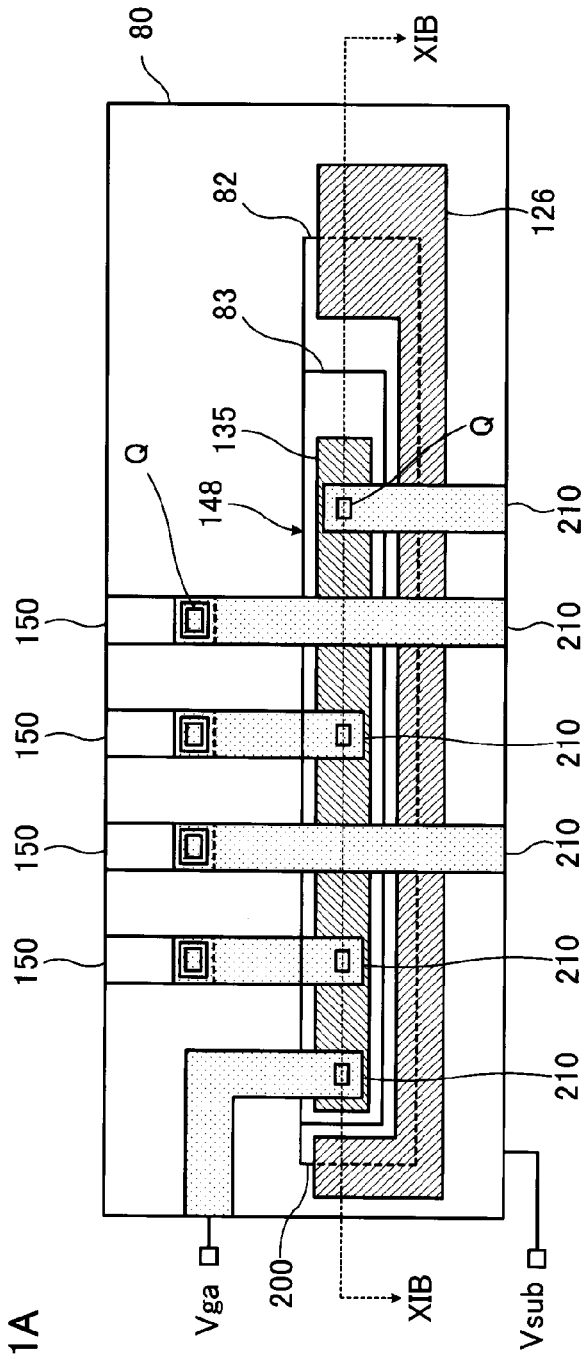
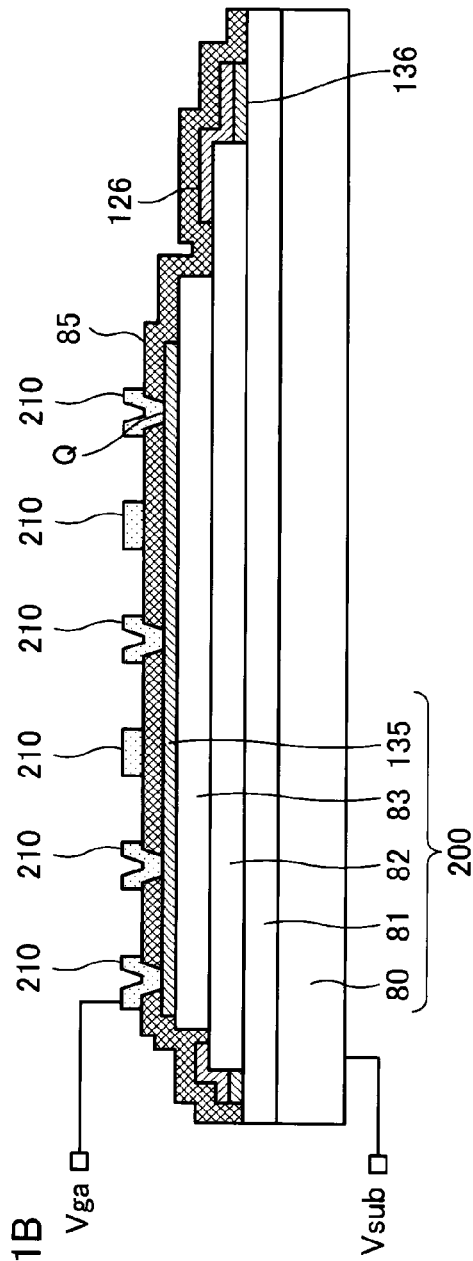
FIG.11A
FIG.11B

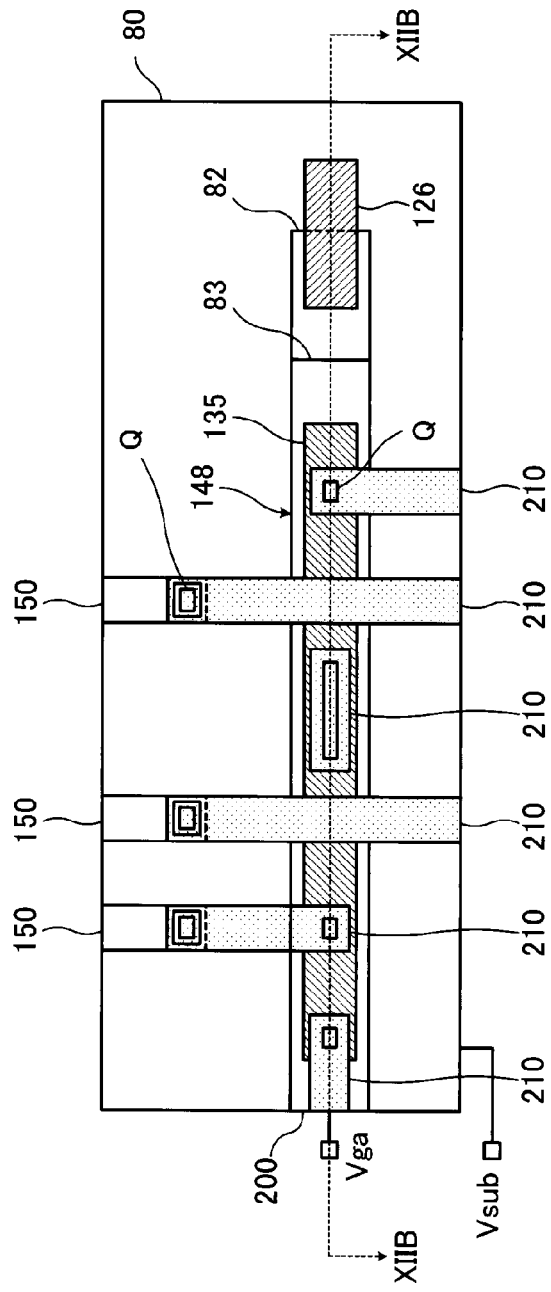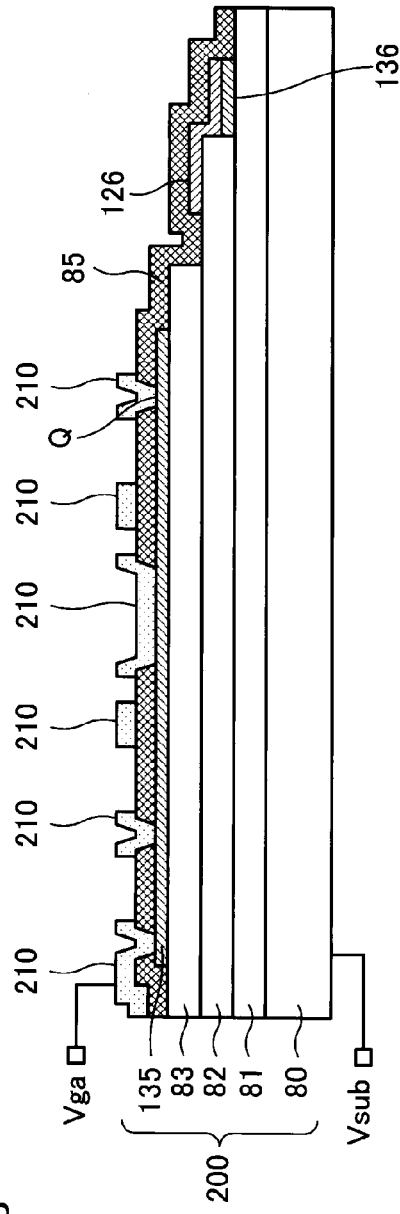
FIG.12A
FIG.12B

US 8,729,569 B2

LIGHT-EMITTING CHIP, PRINT HEAD AND IMAGE FORMING APPARATUS

CROSS REFERENCE TO RELATED APPLICATIONS

This application is based on and claims priority under 35 USC §119 from Japanese Patent Application No. 2009-214951 filed Sep. 16, 2009.

BACKGROUND

1. Technical Field

The present invention relates to a light-emitting chip, a print head and an image forming apparatus.

2. Related Art

In an electrophotographic image forming apparatus such as a printer, a copy machine or a facsimile machine, an image is formed on a recording sheet as follows. Firstly, an electrostatic latent image is formed on a uniformly charged photoconductor by causing an optical recording unit to emit light so as to transfer image information onto the photoconductor. Then, the electrostatic latent image is made visible by being developed with toner. Lastly, the toner image is transferred on and fixed to the recording sheet. In addition to an optical-scanning recording unit that performs exposure by laser scanning in the first scanning direction using a laser beam, a recording device using the following LED print head (LPH) has been employed as such an optical recording unit in recent years in response to demand for downsizing the apparatus. This LPH includes a large number of light-emitting diodes (LEDs), serving as light-emitting elements, arrayed in the first scanning direction.

SUMMARY

According to an aspect of the present invention, there is provided a light-emitting chip including: a substrate; plural light-emitting thyristors that each have a pnpn structure formed of a first stacked-semiconductor layer in which at least 4 semiconductor layers having different conductivity types and including the substrate are stacked on the substrate; a lower wiring that is formed of a second stacked-semiconductor layer in which at least 3 semiconductor layers having different conductivity types and including the substrate are stacked on the substrate, and that has a semiconductor layer between the substrate and an uppermost semiconductor layer of the second stacked-semiconductor layer having a fixed potential so that any one of p-n junctions between the substrate and the uppermost semiconductor layer is reversely biased with respect to potentials respectively applied to the substrate and the uppermost semiconductor layer; and an upper wiring that is provided on the lower wiring so as to intersect with the lower wiring through an isolation layer.

BRIEF DESCRIPTION OF THE DRAWINGS

An Exemplary embodiment of the present invention will be described in detail based on the following figures, wherein:

FIG. 6A is a planar layout of a portion mainly including the transfer thyristors, the memory thyristors, the holding thyristors, and the light-emitting thyristors of the light-emitting chip;

FIG. 6B is a cross-sectional view of FIG. 6A;

FIG. 9A is a plane view for explaining the structure of the lower wiring that uses the stacked semiconductor layers in this exemplary embodiment in more detail;

FIG. 9B is a cross-sectional view of FIG. 9A;

FIG. 11A is a plane view for explaining further configuration of the lower wiring using the stacked semiconductor layers;

FIG. 11B is a cross-sectional view of the FIG. 11A;

FIG. 12A is a plane view for explaining the configuration of the lower wiring using the stacked semiconductor layers, which has a reduced resistance;

FIG. 12B is a cross sectional view of FIG. 12A;

DETAILED DESCRIPTION

Hereinafter, a description will be given of an exemplary embodiment of the present invention in detail with reference to the accompanying drawings.

(Image Forming Apparatus)

Figure 1:
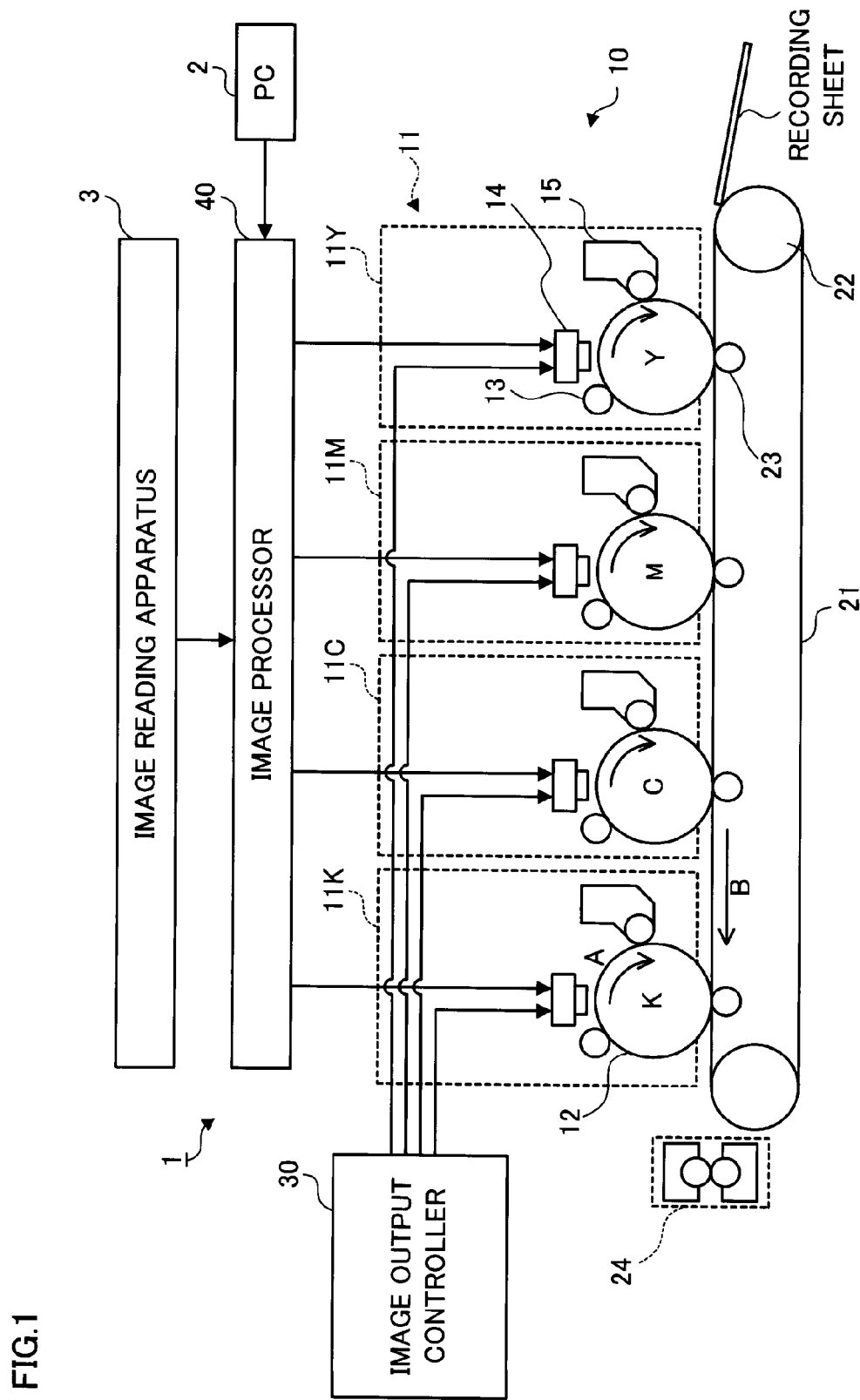
FIG. 1 is a diagram for explaining an example of an overall configuration of an image forming apparatus to which this exemplary embodiment is applied.

FIG. 1 is a diagram for explaining an example of an overall configuration of an image forming apparatus 1 to which this exemplary embodiment is applied. The image forming apparatus 1 shown in FIG. 1 is what is generally termed as a tandem image forming apparatus. The image forming apparatus 1 includes an image forming process unit 10, an image output controller 30 and an image processor 40. The image forming process unit 10 forms an image in accordance with different color image datasets. The image output controller 30 controls the image forming process unit 10. The image processor 40, which is connected to devices such as a personal computer (PC) 2 and an image reading apparatus 3, performs predefined image processing on image data received from the above devices.

The image forming process unit 10 includes image forming units 11 formed of multiple engines arranged in parallel at regular intervals. The image forming units 11 are formed of four image forming units 11Y, 11M, 11C and 11K. Each of the image forming units 11Y, 11M, 11C and 11K includes a photoconductive drum 12, a charging device 13, a print head 14 and a developing device 15. On the photoconductive drum 12, which is an example of an image carrier, an electrostatic latent image is formed, and the photoconductive drum 12 retains a toner image. The charging device 13, as an example of a charging unit, uniformly charges the surface of the photoconductive drum 12 at a predetermined potential. The print head 14 exposes the photoconductive drum 12 charged by the charging device 13. The developing device 15, as an example of a developing unit, develops an electrostatic latent image formed by the print head 14. Here, the image forming units 11Y, 11M, 11C and 11K have approximately the same configuration excluding colors of toner put in the developing devices 15. The image forming units 11Y, 11M, 11C and 11K form yellow (Y), magenta (M), cyan (C) and black (K) toner images, respectively.

In addition, the image forming process unit 10 further includes a sheet transport belt 21, a drive roll 22, transfer rolls 23 and a fixing device 24. The sheet transport belt 21 transports a recording sheet as a transferred body so that different color toner images respectively formed on the photoconductive drums 12 of the image forming units 11Y, 11M, 11C and 11K are transferred on the recording sheet by multilayer transfer. The drive roll 22 is a roll that drives the sheet transport belt 21. Each transfer roll 23, as an example of a transfer unit, transfers a toner image formed on the corresponding photoconductive drum 12 onto the recording sheet. The fixing device 24 fixes the toner images on the recording sheet.

In this image forming apparatus 1, the image forming process unit 10 performs an image forming operation on the basis of various kinds of control signals supplied from the image output controller 30. Under the control by the image output controller 30, the image data received from the personal computer (PC) 2 or the image reading apparatus 3 is subjected to image processing by the image processor 40, and then the resultant dataset is supplied to the corresponding image forming unit 11. Then, for example in the black (K) color image forming unit 11K, the photoconductive drum 12 is charged at a predetermined potential by the charging device 13 while rotating in an arrow A direction, and then is exposed by the print head 14 emitting light on the basis of the image dataset supplied from the image processor 40. By this operation, the electrostatic latent image for the black (K) color image is formed on the photoconductive drum 12. Thereafter, the electrostatic latent image formed on the photoconductive drum 12 is developed by the developing device 15, and accordingly the black (K) color toner image is formed on the photoconductive drum 12. Similarly, yellow (Y), magenta (M) and cyan (C) color toner images are formed in the image forming units 11Y, 11M and 11C, respectively.

The respective color toner images on the photoconductive drums 12, which are formed in the respective image forming units 11, are electrostatically transferred to the recording sheet supplied with the movement of the sheet transport belt 21 by a transfer electric field applied to the transfer rolls 23, in sequence. Here, the sheet transport belt 21 moves in an arrow B direction. By this operation, a synthetic toner image, which is superimposed color-toner images, is formed on the recording sheet.

Thereafter, the recording sheet on which the synthetic toner image is electrostatically transferred is transported to the fixing device 24. The synthetic toner image on the recording sheet transported to the fixing device 24 is fixed on the recording sheet through fixing processing using heat and pressure by the fixing device 24, and then is outputted from the image forming apparatus 1.

(Print Head)

Figure 2:
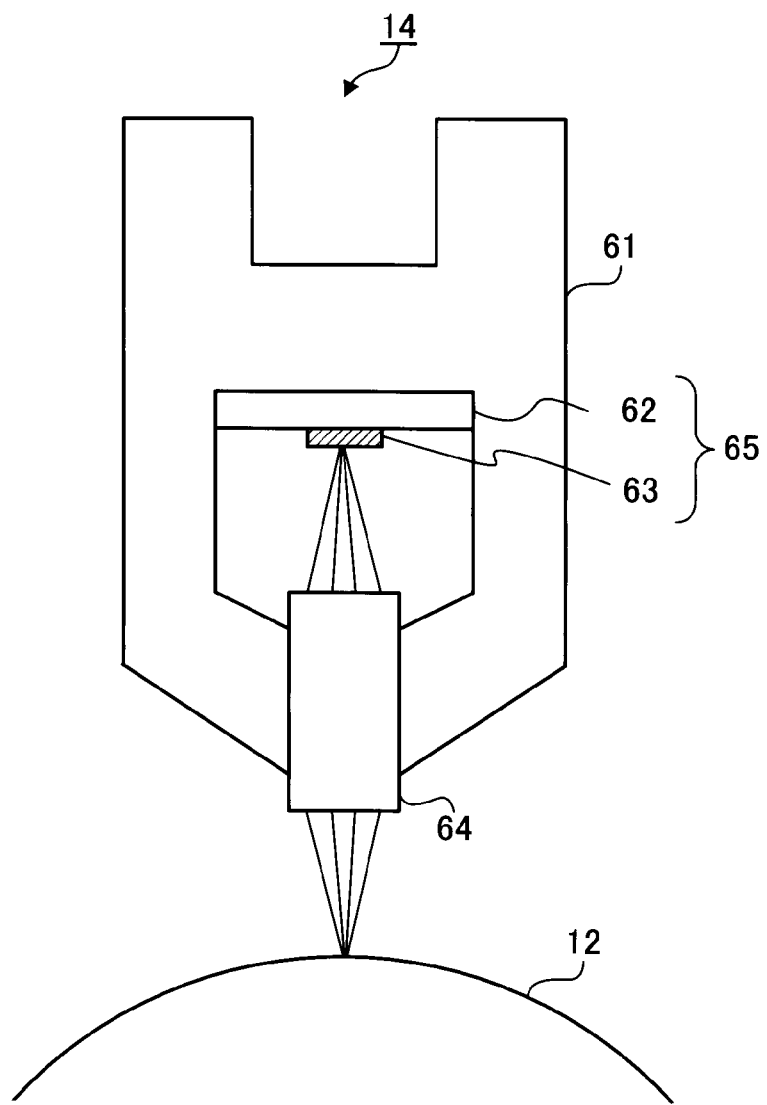
FIG. 2 is a view for explaining a structure of the print head to which this exemplary embodiment is applied.

FIG. 2 is a view for explaining a structure of the print head 14 to which this exemplary embodiment is applied. The print head 14 includes a housing 61, a light-emitting portion 63, a circuit board 62 and a rod lens array 64. The light-emitting portion 63, as an example of an exposure unit, has multiple LEDs (which are light-emitting thyristors in the present exemplary embodiment). On the circuit board 62, the light-emitting portion 63, a signal generating circuit 100 (see FIG. 3 to be described later) that drives the light-emitting portion 63, and the like are mounted. The rod lens array 64, as an example of an optical unit, focuses light emitted by the light-emitting portion 63 onto the surface of the photoconductive drum 12. Here, the light-emitting portion 63, the signal generating circuit 100 and the circuit board 62 on which these components are mounted will be called a light-emitting device 65.

The housing 61 is made of metal, for example, and supports the circuit board 62 and the rod lens array 64. The housing 61 is set so that the light-emitting points of the light-emitting portions 63 are located on the focal plane of the rod lens array 64. In addition, the rod lens array 64 is arranged along an axial direction of the photoconductive drum 12 (the first scanning direction).

(Light-Emitting Device)

Figure 3:
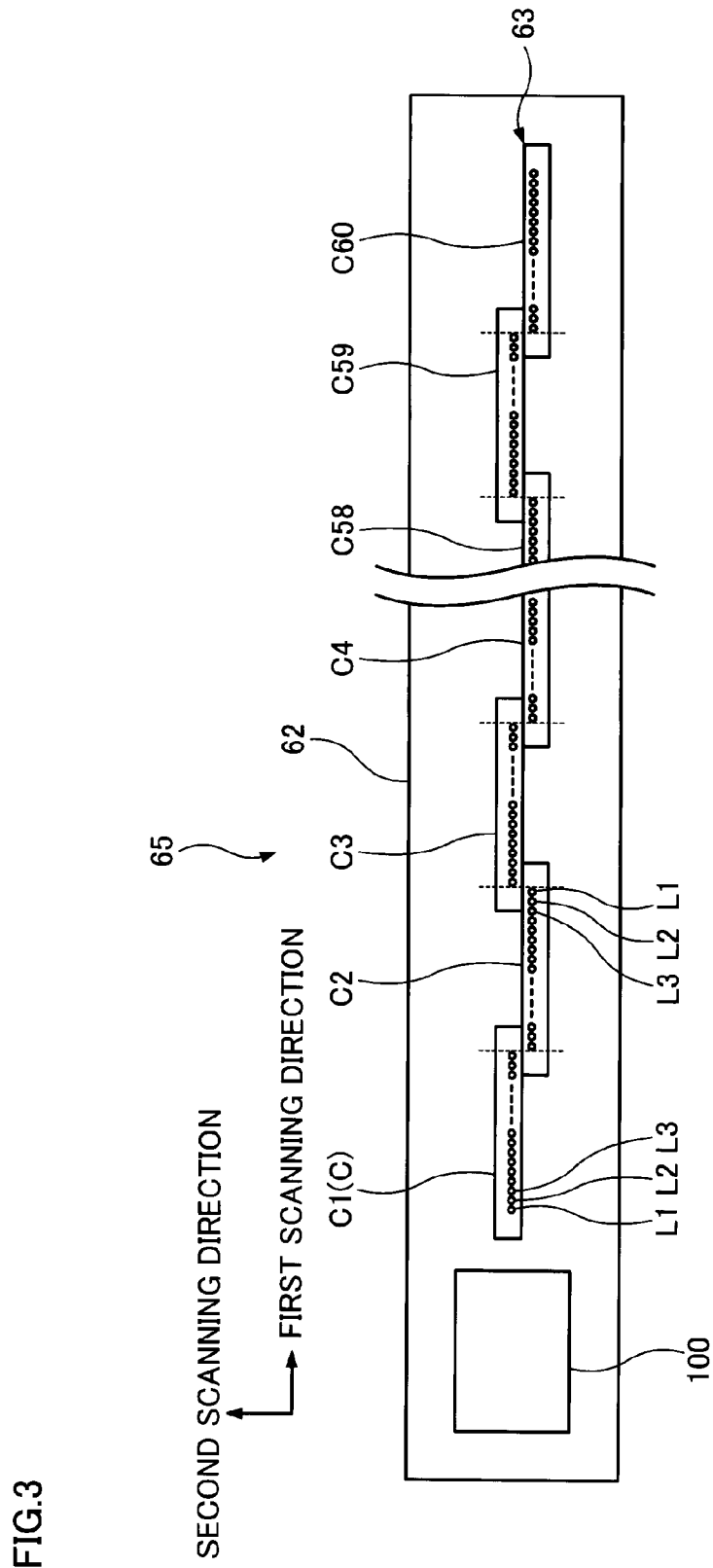
FIG. 3 is a top view of the light-emitting device.

FIG. 3 is a top view of the light-emitting device 65.

As shown in FIG. 3, the light-emitting portion 63 of the light-emitting device 65 is formed of 60 light-emitting chips C1 to C60 arranged in two lines in the first scanning direction on the circuit board 62. Here, the 60 light-emitting chips C1 to C60 are arrayed in a zigzag pattern in which each adjacent two of the light-emitting element chips C1 to C60 face each other. Note that, if the light-emitting chips C1 to C60 are not distinguished, they are described as light-emitting chips C (C1 to C60) or light-emitting chips C. The same is true for the other terms.

All of the light-emitting chips C (C1 to C60) have the same configuration. Each of the light-emitting chips C (C1 to C60) has a light-emitting thyristor array (light-emitting element array) formed of light-emitting thyristors L1, L2, L3 . . . as described later. The light-emitting thyristor array is arranged along long sides of the rectangular of the light emitting chips C. The light-emitting thyristor array is arranged so as to come close to one of the long sides and so as to have the light-emitting thyristors L1, L2, L3 . . . at regular intervals. Here, odd-numbered light-emitting chips C1, C3, C5 . . . and even-numbered light-emitting chips C2, C4, C6 . . . are arranged so as to face each other. In addition, the light-emitting chips C1 to C60 are arranged so that the light-emitting thyristors are arranged at regular intervals in the first scanning direction also in connecting portions of the light-emitting chips C that are shown as dashed lines.

Further, the light-emitting device 65 includes the signal generating circuit 100 that drives the light-emitting portion 63, as described above.

Note that, if the light-emitting thyristors L1, L2, L3 . . . are not distinguished, they are called light-emitting thyristors L. The same is true for the other terms.

Figure 4:
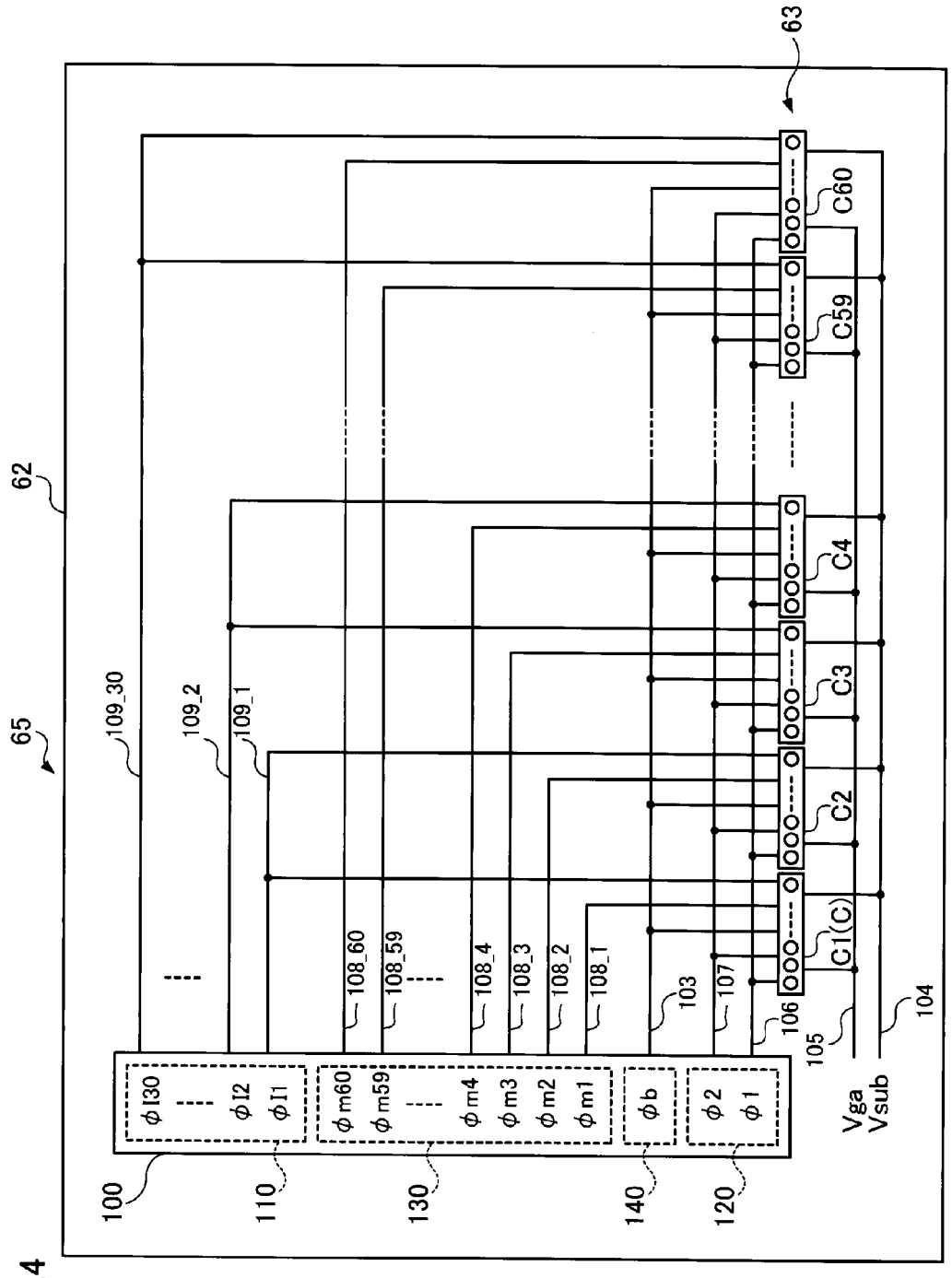
FIG. 4 is a diagram for explaining a configuration of the signal generating circuit and a wiring configuration of the signal generating circuit and the light-emitting chips in the light-emitting device.

FIG. 4 is a diagram for explaining a configuration of the signal generating circuit 100 and a wiring configuration of the signal generating circuit 100 and the light-emitting chips C (C1 to C60) in the light-emitting device 65. Note that, in FIG. 4, since a description will be given of the wiring configuration, the light-emitting chips C1 to C60 are not illustrated as the zigzag pattern.

To the signal generating circuit 100, image datasets subjected to the image processing and various kinds of control signals are inputted from the image output controller 30 and the image processor 40 (see FIG. 1), although the illustration thereof is omitted. Then, the signal generating circuit 100 performs rearrangement of the image datasets, correction of intensity of the light emission and the like on the basis of the image datasets and the various kinds of control signals.

The signal generating circuit 100 includes a light-up signal generating unit 110 that transmits, to the light-emitting chips C (C1 to C60), light-up signals φI (φI1 to φI30) for supplying electric power for light emission to the light-emitting thyristors L.

The signal generating circuit 100 includes a transfer signal generating unit 120 that transmits, to the light-emitting chips C1 to C60, a first transfer signal φ1 and a second transfer signal φ2 on the basis of the various kinds of control signals. Further, the signal generating circuit 100 includes a memory signal generating unit 130 that transmits memory signals φm (φm1 to φm60) that designate the light-emitting thyristors L to be caused to light up, on the basis of the image dataset. Furthermore, the signal generating circuit 100 includes a holding signal generating unit 140 that transmits a holding signal φb giving an instruction that information on a position (number) of the light-emitting thyristor L to be caused to light up is temporarily held.

A power supply line 104 is provided to the circuit board 62 of the light-emitting device 65. The power supply line 104 is connected to Vsub terminals (see FIG. 5 to be described later) of the light-emitting chips C (C1 to C60), and supplies a reference potential Vsub (for example, 0 V). In addition, another power supply line 105 is provided to the circuit board 62. The power supply line 105 is connected to Vga terminals (see FIG. 5 to be described later) of the light-emitting chips (C1 to C60), and supplies a power supply potential Vga for power supply (for example, −3.3 V).

Moreover, a first transfer signal line 106 and a second transfer signal line 107 are provided to the circuit board 62. The first transfer signal line 106 and the second transfer signal line 107 respectively transmit the first transfer signal φ1 and the second transfer signal φ2 from the transfer signal generating unit 120 of the signal generating circuit 100 to the light-emitting portion 63. The first transfer signal line 106 and the second transfer signal line 107 are parallely connected to φ1 terminals and φ2 terminals (see FIG. 5 to be described later) of the light-emitting chips C (C1 to C60), respectively.

Further, 60 memory signal lines 108 (108_1 to 108_60) are provided to the circuit board 62. The memory signal lines 108 transmit the respective memory signals φm (φm1 to φm60) from the memory signal generating unit 130 of the signal generating circuit 100 to the corresponding light-emitting chips C (C1 to C60). The memory signal lines 108_1 to 108_60 are respectively connected to φm terminals (see FIG. 5 to be described later) of the light-emitting chips C1 to C60. That is, the memory signals φm (φm1 to φm60) are individually transmitted to the light-emitting chips C (C1 to C60).

Furthermore, a holding signal line 103 is provided to the circuit board 62. The holding signal line 103 transmits the holding signal φb from the holding signal generating unit 140 of the signal generating circuit 100 to the light-emitting portion 63. The holding signal line 103 is parallely connected to φb terminals of the light-emitting chips C (C1 to C60) (see FIG. 5 to be described later).

Furthermore, 30 light-up signal lines 109 (109_1 to 109_30) are also provided to the circuit board 62. The light-up signal lines 109 transmit the respective light-up signals φI (φI1 to φI30) from the light-up signal generating unit 110 of the signal generating circuit 100 to the corresponding light-emitting chips C (C1 to C60). Each of the light-up signal lines 109 (109_1 to 109_30) is connected to corresponding φI terminals (see FIG. 5 to be described later) of two light-emitting chips C as a pair. For example, the light-up signal line 109_1 is parallely connected to the φI terminals of the light-emitting chips C1 and C2, and the light-up signal φI1 is sharably supplied thereto. Similarly, the light-up signal line 109_2 is parallely connected to the φI terminals of the light-emitting chips C3 and C4, and the light-up signal φI2 is sharably supplied thereto. The others have the similar configuration. Thus, the number of the light-up signals φI (30) is half of the number of the light-emitting chips C (60).

As described above, in the present exemplary embodiment, the first transfer signal φ1, the second transfer signal φ2 and the holding signal φb are sharably transmitted to all of the light-emitting chips C (C1 to C60). The memory signals φm (φm1 to φm60) are individually transmitted to the light-emitting chips C (C1 to C60). Each of the light-up signals φI (φI1 to φI30) is transmitted to the corresponding two of the light-emitting chips C (C1 to C60).

By this configuration, the number of the light-up signal lines 109 (109_1 to 109_30) is set smaller than the number of the light-emitting chips C (C1 to C60).

The light-up signal lines 109 are required to have a low resistance in order to supply a current for lighting-up (light emission) to the light-emitting thyristors L. For this reason, if the light-up signal lines 109 are configured of wide wirings, the width of the circuit board 62 becomes larger, which prevents downsizing of the print head 14. On the other hand, if the signal lines are configured to have multiple layers in order to make the width of the circuit board 62 narrower, this configuration prevents cost reduction of the print head 14.

In the present exemplary embodiment, the number of the light-up signal lines 109 is reduced by half in comparison with a case where the light-up signal lines 109 are respectively provided for the light-emitting chips C, and thus the print head 14 may be downsized and produced at low cost.

On the other hand, in the present exemplary embodiment, the memory signal lines 108 are provided so that the number of the memory signal lines 108 is the same as the number of the light-emitting chips C. As described later, it is only necessary that the memory signal lines 108 supply the current that keeps ON states of the memory thyristors M (see FIG. 5 to be described later). The current that keeps the ON states of the memory thyristors M is smaller than the current for the lighting-up (light emission) of the light-emitting thyristors L, and thus it is acceptable that the memory signal lines 108 are not configured of wide wirings having a low resistance like the light-up signal lines 109. Thus, even if the same number of the memory signal lines 108 as that of the light-emitting chips C is provided, the width of the circuit board 62 is difficult to be affected.

In other words, reduction of the number of the light-up signal lines 109 may achieve the downsizing of the print head 14 and the production thereof at low cost.

(Equivalent Circuit of Light-Emitting Chips)

Figure 5:
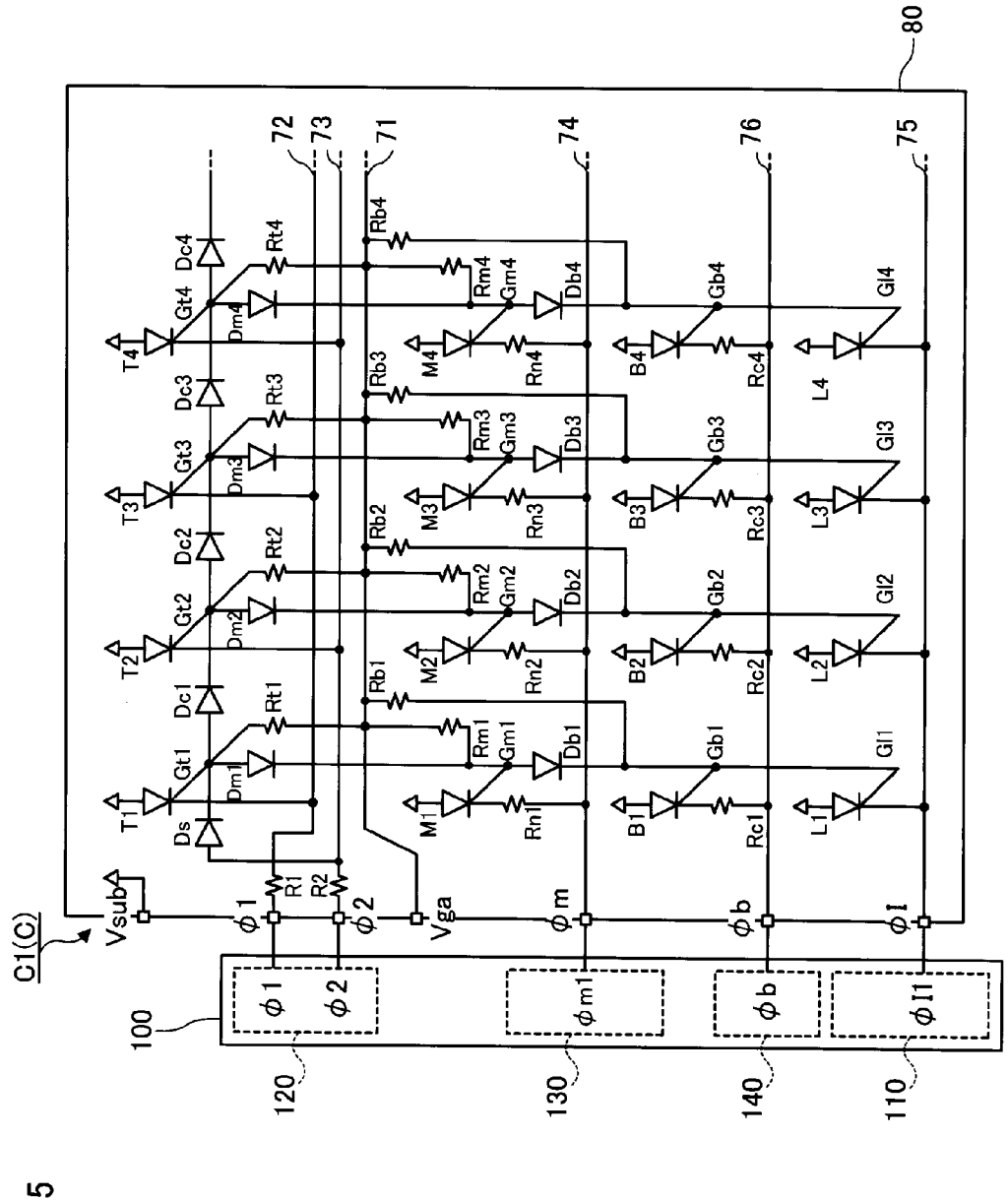
FIG. 5 is a diagram for explaining an equivalent circuit of the light-emitting chips as the self-scanning light-emitting element array (SLED) chips.

FIG. 5 is a diagram for explaining an equivalent circuit of the light-emitting chips C (C1 to C60) as the self-scanning light-emitting element array (SLED) chips. Here, a description will be given of the light-emitting chip C1 as an example. However, the other light-emitting chips C2 to C60 have the same configuration as the light-emitting chip C1. Thus, the light-emitting chips C (C1 to C60) is exemplified by the light-emitting chip C1 (C) since the other light-emitting chips C2 to C60 have the same configuration as the light-emitting chip C1.

The light-emitting chip C1 (C) includes a transfer thyristor array formed of the transfer thyristors T1, T2, T3 . . . arrayed in line, a memory thyristor array formed of the memory thyristors M1, M2, M3 . . . similarly arrayed in line, a holding thyristor array formed of the holding thyristors B1, B2, B3 . . . similarly arrayed in line, and a light-emitting thyristor array formed of the light-emitting thyristors L1, L2, L3 . . . similarly arrayed in line, which are provided on a substrate 80.

Note that, the transfer thyristors T, memory thyristors M, holding thyristors B and light-emitting thyristors L are semiconductor elements each having three terminals, that is, an anode terminal (anode), a cathode terminal (cathode) and a gate terminal (gate).

The light-emitting chip C1 (C) includes coupling diodes Dc1, Dc2, Dc3 . . . connecting respective pairs that are each formed of two of the transfer thyristors T1, T2, T3 . . . and that are formed in numerical order. Moreover, the light-emitting chip C1 (C) includes connecting diodes Dm1, Dm2, Dm3 . . . and connecting diodes Db1, Db2, Db3 . . . .

In addition, the light-emitting chip C1 (C) includes power supply line resistances Rt1, Rt2, Rt3 . . . , power supply line resistances Rm1, Rm2, Rm3 . . . , power supply line resistances Rb1, Rb2, Rb3 . . . , resistances Rn1, Rn2, Rn3 . . . , and resistances Rc1, Rc2, Rc3 . . . .

Note that, in the present exemplary embodiment, if the number of the light-emitting thyristors L in the light-emitting thyristor array is set at 128, the respective numbers of the transfer thyristors T, the memory thyristors M and the holding thyristors B are also set at 128. Similarly, the respective numbers of the connecting diodes Dm, the power supply line resistances Rt, Rm and Rb, and the resistances Rn and Rc are 128. Meanwhile, the number of the coupling diodes Dc is 127, which is less by 1 than the number of the transfer thyristors T.

These elements are respectively arrayed in numerical order from the left side of FIG. 5, such as 1, 2, 3 . . . .

Note that, in FIG. 5, only a part mainly including the transfer thyristors T1 to T4, the memory thyristors M1 to M4, the holding thyristors B1 to B4 and the light-emitting thyristors L1 to L4 is shown. The other part is a repeat of the above part.

Note that, the respective numbers of the transfer thyristors T, the memory thyristors M and the holding thyristors B are not necessarily the same as the number of the light-emitting thyristors L, and they may be larger than the number of the light-emitting thyristors L.

Further, the light-emitting chip C1 (C) includes one start diode Ds. In order to prevent an excessive current from flowing into a first transfer signal line 72 and a second transfer signal line 73, the light-emitting chip C1 (C) includes current limitation resistances R1 and R2.

Next, a description will be given of electric connections between the elements in the light-emitting chip C1 (C).

Anode terminals of the transfer thyristors T, anode terminals of the memory thyristors M, anode terminals of the holding thyristors B and anode terminals of the light-emitting thyristors L are connected to the substrate 80 of the light-emitting chip C1 (anode common). These anode terminals are connected to the power supply line 104 (see FIG. 4) through the Vsub terminals provided to the substrate 80. To this power supply line 104, the reference potential Vsub is supplied.

Gate terminals Gt of the transfer thyristors T are connected to a power supply line 71 through the respective power supply line resistances Rt which are provided so as to correspond to the respective transfer thyristors T. The power supply line 71 is connected to the Vga terminal. The Vga terminal is connected to the power supply line 105 (see FIG. 4), and the power supply potential Vga is supplied thereto.

Cathode terminals of the odd-numbered transfer thyristors T1, T3, T5 . . . are connected to the first transfer signal line 72 in accordance with the array of the transfer thyristors T. The first transfer signal line 72 is connected to the φ1 terminal that is an input terminal of the first transfer signal φ1, through the current limitation resistance R1. To this φ1 terminal, the first transfer signal line 106 (see FIG. 4) is connected, and the first transfer signal φ1 is supplied thereto.

Meanwhile, cathode terminals of the even-numbered transfer thyristors T2, T4, T6 . . . are connected to the second transfer signal line 73 in accordance with the array of the transfer thyristors T. The second transfer signal line 73 is connected to the φ2 terminal that is an input terminal of the second transfer signal φ2, through the current limitation resistance R2. To this φ2 terminal, the second transfer signal line 107 (see FIG. 4) is connected, and the second transfer signal φ2 is supplied thereto.

Cathode terminals of the memory thyristors M are connected to the memory signal line 74 through the corresponding resistances Rn. The memory signal line 74 is connected to the φm terminal that is an input terminal of the memory signal φm (φm1 in the case of the light-emitting chip C1). To the φm terminal, the memory signal line 108 (see FIG. 4: the memory signal line 108_1 in the case of the light-emitting chip C1) is connected, and the memory signal φm (see FIG. 4: the memory signal φm1 in the case of the light-emitting chip C1) is supplied thereto.

Cathode terminals of the holding thyristors B are connected to the holding signal line 76 through the corresponding resistances Rc. The holding signal line 76 is connected to the φb terminal that is an input terminal of the holding signal φb. To the φb terminal, the holding signal line 103 (see FIG. 14) is connected, and the holding signal φb is supplied thereto.

Each of the gate terminals Gt1, Gt2, Gt3 . . . of the transfer thyristors T1, T2, T3 . . . is connected to corresponding one of gate terminals Gm1, Gm2, Gm3 . . . of the memory thyristors M1, M2, M3 . . . , which has the same number as the gate terminal Gt to be connected thereto, through corresponding one of the connecting diodes Dm1, Dm2, Dm3 . . . , with a one-to-one relationship. In other words, the anode terminals of the connecting diodes Dm are respectively connected to the gate terminals Gt of the transfer thyristors T, and the cathode terminals of the connecting diodes Dm are respectively connected to the gate terminals Gm of the memory thyristors M.

Further, each of the gate terminals Gb1, Gb2, Gb3 . . . of the holding thyristors B1, B2, B3 . . . is connected to corresponding one of the gate terminals Gm1, Gm2, Gm3 . . . of the memory thyristors M1, M2, M3 . . . , which has the same number as the gate terminal Gb to be connected thereto, through corresponding one of the connecting diodes Db1, Db2, Db3 . . . , with a one-to-one relationship. In other words, the cathode terminals of the connecting diodes Db are respectively connected to the gate terminals Gb of the holding thyristors B, and the anode terminals of the connecting diodes Db are respectively connected to the gate terminals Gm of the memory thyristors M.

Furthermore, each of the gate terminals Gb1, Gb2, Gb3 . . . of the holding thyristors B1, B2, B3 . . . is connected to corresponding one of the gate terminals G11, G12, G13 . . . of the light-emitting thyristors L1, L2, L3 . . . , which has the same number as the gate terminal Gb to be connected thereto, with a one-to-one relationship.

Furthermore, each of the gate terminals Gm of the memory thyristors M is connected to the power supply line 71 through corresponding one of the power supply line resistances Rm. Each of the gate terminals Gb of the holding thyristors B is connected to the power supply line 71 through corresponding one of the power supply line resistances Rb.

Each of the coupling diodes Dc1, Dc2, Dc3 . . . is connected between a corresponding pair of the gate terminals Gt. Each of the pairs is formed of two gate terminals Gt among the gate terminals Gt1, Gt2, Gt3 . . . of the transfer thyristors T1, T2, T3 . . . and is formed in numerical order. In other words, each of the coupling diodes Dc is serially connected to the corresponding two of the gate terminals Gt. The coupling diode Dc1 is connected thereto so that a direction thereof is equivalent to a direction of the current flowing from the gate terminal Gt1 to the gate terminal Gt2. The same configuration is applied to the other coupling diodes Dc2, Dc3, Dc4 . . . .

Cathode terminals of the light-emitting thyristors L1, L2, L3 . . . are connected to the light-up signal line 75, and the light-up signal line 75 is connected to the φI terminal that is an input terminal of the light-up signal φI (the light-up signal φI1 in the case of the light-emitting chip C1). To the φI terminal, the light-up signal line 109 (see FIG. 4: the light-up signal line 109_1 in the case of the light-emitting chip C1) is connected, and the light-up signal φI (see FIG. 4: the light-up signal φI1 in the case of the light-emitting chip C1) is supplied thereto.

The gate terminal Gt1 of the transfer thyristor T1, which is positioned on one end side of the transfer thyristor array, is connected to the cathode terminal of the start diode Ds. On the other hand, an anode terminal of the start diode Ds is connected to the second transfer signal line 73.

(Planar Layout and Cross Section of Light-Emitting Chip)

FIG. 6A is a planar layout of a part mainly including the transfer thyristors T1 to T4, the memory thyristors M1 to M4, the holding thyristors B1 to B4, and the light-emitting thyristors L1 to L4 of the light-emitting chip C1 (C). FIG. 6B is a cross-sectional view of FIG. 6A, taken along a line VIB-VIB. FIG. 6B shows cross sections of the transfer thyristor T1, the connecting diodes Dm1 and Db1, the holding thyristor B1 and the light-emitting thyristor L1, as described later. Note that, in FIGS. 6A and 6B, elements and terminals are shown by using the above-mentioned names.

In FIGS. 6A and 6B, an isolation layer provided on each element and a through hole provided to the isolation layer are omitted. Further, in FIG. 6A, upper wirings (upper wirings made of Al or Al alloy) provided on the through holes are shown as straight lines only indicating connecting relationships. In FIG. 6B, the isolation layer, the through holes and the upper wirings are omitted.

As shown in FIG. 6B, the light-emitting chip C1 (C) is configured by stacking a first p-type semiconductor layer 81, a second n-type semiconductor layer 82, a third p-type semiconductor layer 83 and a fourth n-type semiconductor layer 84 in sequence on the substrate 80 as a p-type semiconductor.

Further, plural islands (a first island 141 to an eighth island 148 and the like) are formed by sequentially etching the first p-type semiconductor layer 81, the second n-type semiconductor layer 82, the third p-type semiconductor layer 83 and the fourth n-type semiconductor layer 84.

On the back surface of the substrate 80, back-side common electrodes as the Vsub terminals are formed.

As shown in FIG. 6A, the light-emitting thyristor L1 and the holding thyristor B1 are provided in the first island 141, the memory thyristor M1 and the connecting diode Db1 are provided in the second island 142, the power supply line resistances Rm1, Rb1 and Rt2 are provided in the third island 143, and the coupling diode Dc1, the connecting diode Dm1 and the transfer thyristor T1 are provided in the fourth island 144.

Plural islands similar to the first island 141 to the fourth island 144 are provided in parallel on the substrate 80. In these islands, the light-emitting thyristors L2, L3, L4 . . . , the memory thyristors M2, M3, M4 . . . , the holding thyristors B2, B3, B4 . . . , the transfer thyristors T2, T3, T4 . . . and the like are provided, similarly to the first island 141 to the fourth island 144. The description thereof will be omitted.

Further, the start diode Ds is provided in the fifth island 145, the current limitation resistance R1 is provided in the sixth island 146, and the current limitation resistance R2 is provided in the seventh island 147.

Furthermore, a lower wiring 200 is provided in the eighth island 148.

As shown in FIG. 6B, the light-emitting thyristor L1 provided in the first island 141 has the substrate 80 set as the anode terminal, an n-type electrode 121 set as the cathode terminal, and a p-type electrode 131 set as the gate terminal G11. Here, the n-type electrode 121 is formed of a material being in ohmic contact with the n-type semiconductor layer in a region 111 of the fourth n-type semiconductor layer 84 (hereinafter, the electrode formed of a material being in ohmic contact with the n-type semiconductor layer is called an n-type electrode), and the p-type electrode 131 is formed of a material being in ohmic contact with a p-type semiconductor layer and is located on the third p-type semiconductor layer 83 exposed by removing the fourth n-type semiconductor layer 84 by etching (hereinafter, the electrode formed of a material being in ohmic contact with the p-type semiconductor layer is called a p-type electrode). Further, the surface of the region 111 except a portion on which the n-type electrode 121 is formed emits light.

In other words, the light-emitting thyristor L1 is configured of stacked semiconductor layers formed of the substrate 80 that is a p-type semiconductor, the first p-type semiconductor layer 81, the second n-type semiconductor layer 82, the third p-type semiconductor layer 83 and the fourth n-type semiconductor layer 84, which are serving as an example of a first stacked-semiconductor layer. The light-emitting thyristor L1 is formed of the four semiconductor layers having different conductive types and including the substrate 80.

On the other hand, the holding thyristor B1 provided in the first island 141 includes the substrate 80 set as an anode terminal, an n-type electrode 122 formed on a region 112 of the fourth n-type semiconductor layer 84, which is set as a cathode terminal, and the p-type electrode 131 set as the gate terminal Gb1. Note that, the p-type electrode 131 functions as not only the gate terminal G11 of the light-emitting thyristor L1 but also the gate terminal Gb1 of the holding thyristor B1.

The connecting diode Db1 provided in the second island 142 includes an n-type electrode 123 formed on a region 113 of the fourth n-type semiconductor layer 84, which is set as a cathode terminal, and a p-type electrode 132 formed on the third p-type semiconductor layer 83 exposed by removing the fourth n-type semiconductor layer 84 by etching, which is set as an anode terminal. The p-type electrode 132 is also used as the gate terminal Gm1 of the memory thyristor M1.

The power supply line resistances Rm1, Rb1 and Rt2 provided in the third island 143 are formed between the p-type electrodes formed on the third p-type semiconductor layer 83 (such as the p-type electrode 132). The power supply line resistances Rm1, Rb1 and Rt2 include the third p-type semiconductor layer 83 as a resistive layer.

Note that, the power supply line resistance Rt1 is formed in another island.

The connecting diode Dm1 provided in the fourth island 144 includes an n-type electrode 124 on a region 114 of the fourth n-type semiconductor layer 84, which is set as a cathode terminal, and a p-type electrode 134 on the third p-type semiconductor layer 83 exposed by removing the fourth n-type semiconductor layer 84 by etching, which is set as an anode terminal. The coupling diode Dc1 is formed similarly to the connecting diode Dm1 although the illustration thereof is not shown in FIG. 6B.

The transfer thyristor T1 includes the substrate 80 set as an anode terminal, an n-type electrode 125 formed on a region 115 of the fourth n-type semiconductor layer 84, which is set as a cathode terminal, and the p-type electrode 134 formed on the third p-type semiconductor layer 83 exposed by removing the fourth n-type semiconductor layer 84 by etching, which is set as a gate terminal Gt1.

The p-type electrode 134 functions as not only the gate terminal Gt1 of the transfer thyristor T1 but also the anode terminals of the respective connecting diode Dm1 and the coupling diode Dc1.

The start diode Ds provided in the fifth island 145 is configured similarly to the connecting diode Dm1 provided in the fourth island 144.

The current limitation resistance R1 provided in the sixth island 146 and the current limitation resistance R2 provided in the seventh island 147 are configured similarly to the power supply line resistance Rt1 and the like formed in the third island 143, and include the third p-type semiconductor layer 83 set as a resistive layer.

A p-type electrode 135 formed on the third p-type semiconductor layer 83 exposed by removing the fourth n-type semiconductor layer 84 by etching is provided in the eighth island 148. The eighth island 148 is the lower wiring 200 as described below, and is used as the power supply line 71. Thus, the p-type electrode 135 works as a wiring.

Specifically, the lower wiring 200 is configured by stacked semiconductor layers as an example of a second stacked-semiconductor layer, which are formed of the substrate 80 that is a p-type semiconductor, the first p-type semiconductor layer 81, the second n-type semiconductor layer 82 and the third p-type semiconductor layer 83. The lower wiring 200 is formed of the three semiconductor layers having different conductive types and including the substrate 80.

Here, the material being in ohmic contact with the n-type semiconductor layer and the material being in ohmic contact with the p-type semiconductor layer are individually provided. That is why it is difficult to obtain a good ohmic contact with not only the n-type semiconductor layer and but also the p-type semiconductor layer by using only one material. If a good ohmic contact with both of the n-type semiconductor layer and the p-type semiconductor layer is obtained by using one material, it may be not necessary to separately provide the materials thereof.

A description will be given of connecting relationships between the elements in FIG. 6A.

The p-type electrode 131 that is the gate terminal Gl1 of the light-emitting thyristor L1 and the gate terminal Gb1 of the holding thyristor B1 in the first island 141 is connected to the n-type electrode 123 that is the cathode terminal of the connecting diode Db1 in the second island 142. Further, the n-type electrode 123 is connected to one terminal of the power supply line resistance Rb1 in the third island 143. The other terminal of the power supply line resistance Rb1 is connected to the p-type electrode 135 in the eighth island 148.

The p-type electrode 132 that is the anode terminal of the connecting diode Db1 and the gate terminal Gm1 of the memory thyristor M1 is connected to the p-type electrode 133 that is one terminal of the power supply line resistance Rm1 provided in the third island 143. The other terminal of the power supply line resistance Rm1 is connected to the p-type electrode 135 in the eighth island 148.

Further, the p-type electrode 133 is connected to the n-type electrode 124 that is the cathode terminal of the connecting diode Dm1 provided in the fourth island 144.

The p-type electrode 134 that is the anode terminal of the connecting diode Dm1, the anode terminal of the coupling diode Dc1 and the gate terminal Gt1 of the transfer thyristor T1 is connected to the cathode terminal of the start diode Ds. Further, the p-type electrode 134 is connected to one terminal of the power supply line resistance Rt1. The other terminal of the power supply line resistance Rt1 is connected to the p-type electrode 135 in the eighth island 148.

The cathode terminal of the coupling diode Dc1 is connected to the gate terminal Gt2 of the transfer thyristor T2 adjacent thereto.

The n-type electrode 125 that is the cathode terminal of the transfer thyristor T1 is connected to the first transfer signal line 72. The first transfer signal line 72 is connected to one terminal of the current limitation resistance R1 provided in the sixth island 146. The other terminal of the current limitation resistance R1 is connected to the $\phi 1$ terminal.

The cathode terminal of the transfer thyristor T2 is connected to the second transfer signal line 73. The second transfer signal line 73 is connected to one terminal of the current limitation resistance R2 provided in the seventh island 147. The other terminal of the current limitation resistance R2 is connected to the $\phi 2$ terminal.

The cathode terminal of the memory thyristor M1 provided in the second island 142 is connected to one terminal of the resistance Rn1. The other terminal of the resistance Rn1 is connected to the memory signal line 74, and also connected to the $\phi m$ terminal.

Similarly, the n-type electrode 122 that is the cathode terminal of the holding thyristor B1 provided in the first island 141 is connected to one terminal of the resistance Rc1. The other terminal of the resistance Rc1 is connected to the holding signal line 76, and also connected to the $\phi b$ terminal.

The n-type electrode 121 that is the cathode terminal of the light-emitting thyristor L1 in the first island 141 is connected to the light-up signal line 75. The light-up signal line 75 is connected to the $\phi I$ terminal.

The p-type electrode 135 in the eighth island 148 is connected to the Vga terminal, and functions as the power supply line 71 together with the third p-type semiconductor layer 83, as described later.

The connection relationships between the other transfer thyristors T, memory thyristors M, holding thyristors B, light-emitting thyristors L, diodes (Dc, Dm, Db), power supply line resistances (Rm, Rt, Rb) and resistances (Rn, Rc) are the same as the above although the description thereof is omitted here.

Straight lines (upper wirings) indicating the connecting relationships in FIG. 6A do not intersect with each other. Note that, a part of these straight lines (upper wirings) intersects with the eighth island 148 configuring the lower wiring 200. However, this part is separated by the isolation layer which is omitted in the figure, except at portions where the through holes for the connections with the upper wirings are provided, and thus it does not short out. In other words, the lower wiring 200 and the upper wirings illustrated as straight lines indicating the connecting relationships configure an intersecting wiring.

Thus, the straight lines (upper wirings) indicating the connecting relationships in FIG. 6A may be achieved by a wiring layer using a one layer made of Al or Al alloy, without using a multi-layer wiring.

As described above, the light-emitting chips C (C1 to C60) that are the self-scanning light-emitting element array (SLED) chips shown in FIG. 5 are configured.

In the light-emitting chips C shown in the present exemplary embodiment, the width of the light-emitting chips C (length of the substrate 80 in the up-and-down direction in FIG. 6A) is thought to be determined depending on pitches of the wirings (upper wirings) formed in the longitudinal direction of the light-emitting chips C (left-and-right direction of the substrate 80 in FIG. 6A), such as the first transfer signal line 72, the second transfer signal line 73, the memory signal line 74, the holding signal line 76 and the light-up signal line 75. Therefore, if the power supply line 71 formed in the longitudinal direction of the light-emitting chips C is configured as the lower wiring 200, the number of the wirings is reduced, and thus the width of the light-emitting chips C may be made smaller.

If the configuration of the light-emitting chips C is more complicated than the configuration shown in the present exemplary embodiment, the number of the wirings formed in the longitudinal direction of the light-emitting chips C may be thought to be increased. To avoid this, by providing the lower wiring such as the power supply line 71 in the present exemplary embodiment, the width of the light-emitting chips C is suppressed to be small while multilayer formation of the upper wirings is suppressed, which suppresses increase in cost of the light-emitting chips C.

Note that, the layout shown in FIGS. 6A and 6B is an example, and the other example may be employed.

Note that, the configuration of the lower wiring 200 will be described later in detail.

(Operation of Light-Emitting Portion)

Next, a description will be given of the operation of the light-emitting portion 63.

In each of the light-emitting chips C (C1 to C60), a sequential operation (light-up control) that causes the light-emitting thyristors L to light up (emit light) and to be put out is performed in sequence by a pair of the first transfer signal φ1 and the second transfer signal φ2. Accordingly, the operation of the light-emitting portion 63 is recognized if the operation of the light-emitting chip C1 is described. Hereinafter, the operation of the light-emitting chips C will be described by taking the light-emitting chip C1 as an example.

(Light-Up Control of Light-Emitting Chips)

Figure 7:
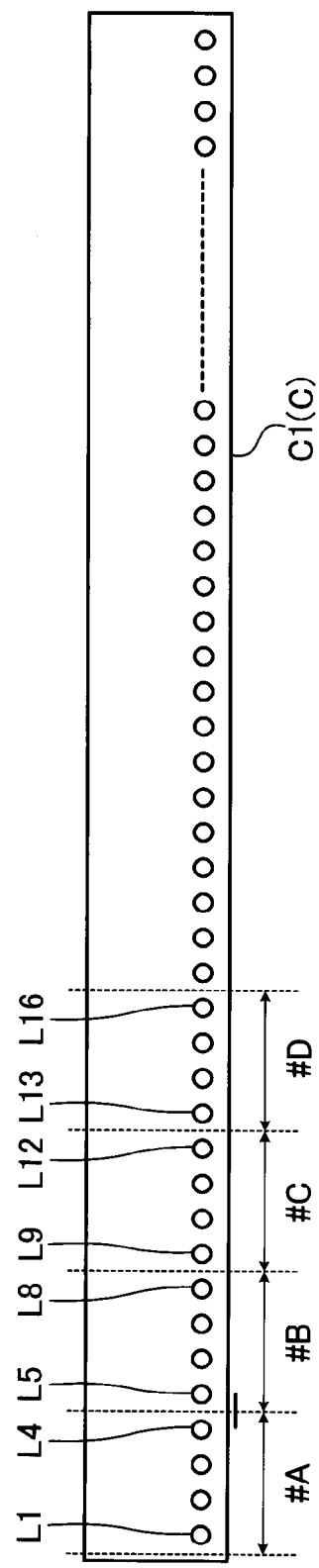
FIG. 7 is a view for explaining a summary of the operation of the light-emitting chip.

FIG. 7 is a view for explaining a summary of the operation of the light-emitting chip C1 (C).

In the present exemplary embodiment, the light-up control is performed in the light-emitting chip C1 (C), by using a group formed of plural light-emitting points (light-emitting thyristors L) set in advance.

FIG. 7 shows a case where the light-up control is performed by using a group formed of 4 light-emitting thyristors L. In other words, in the present exemplary embodiment, up to the 4 light-emitting thyristors L are caused to light up (emit light) at the same time. First, light-up control is performed on 4 light-emitting thyristors L1 to L4, which are shown as a group #A starting from the left end of the light-emitting chip C1 (C). Next, light-up control is performed on 4 light-emitting thyristors L5 to L8 in a group #B adjacent to the group #A. If the number of the light-emitting thyristors L provided to the light-emitting chip C is 128, light-up control is repeatedly performed on each 4 light-emitting thyristors L until the light-up control is performed on the light-emitting thyristor L128, in a similar manner.

In other words, in the present exemplary embodiment, the light-up control is performed on the groups #A, #B . . . in sequence, in chronological order, and the light-up control is performed on plural light-emitting points (light-emitting thyristors L) at the same time in each of the groups #A, #B . . . .

The light-up control is formed of a step (memory step) in which the light-emitting thyristors L to be caused to light up are designated for each group and are memorized, and a step (light-up step) in which the designated light-emitting thyristors L are caused to light up.

(Driving Waveforms)

Figure 8:
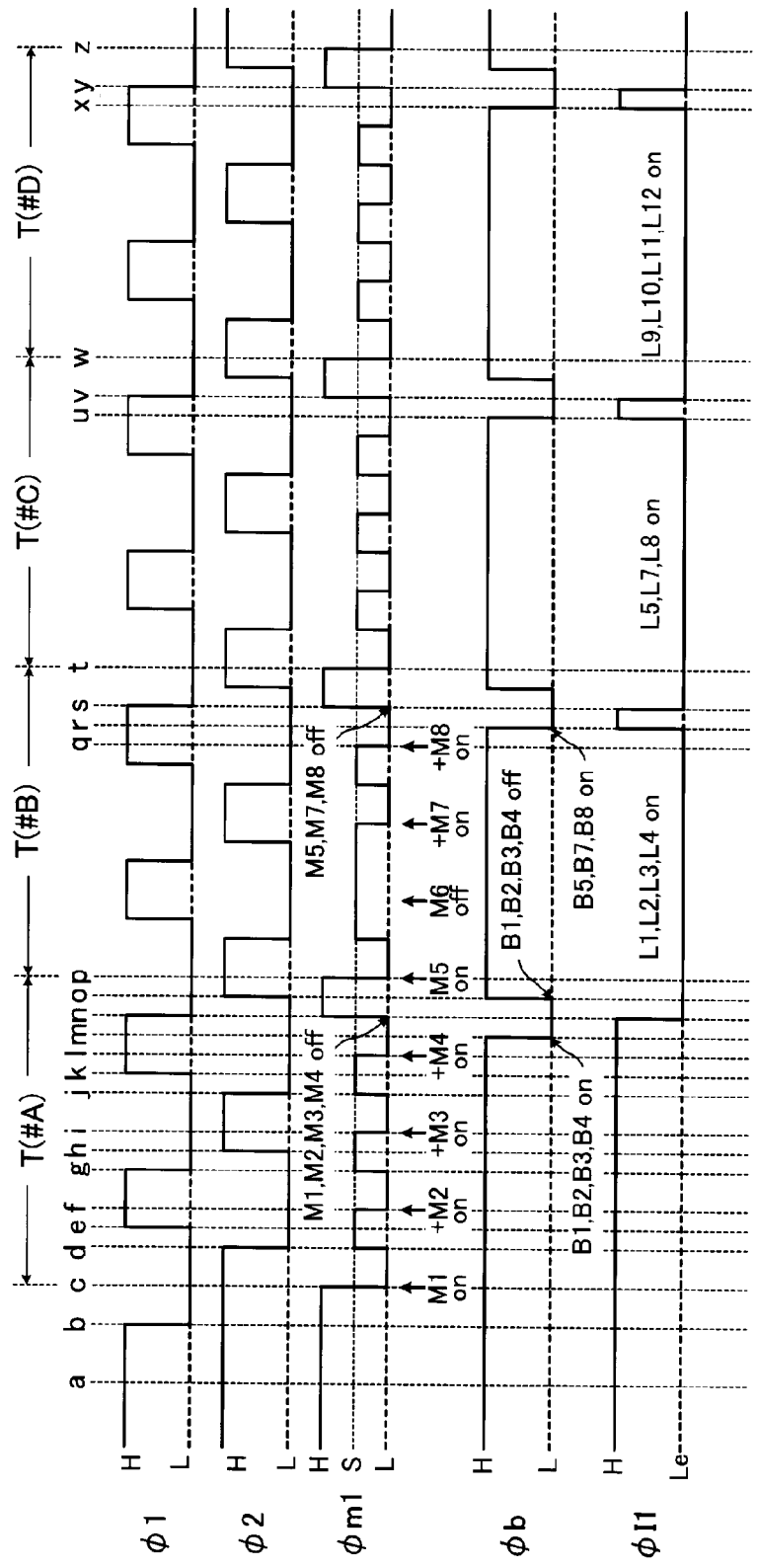
FIG. 8 is a timing chart for explaining the operation of the light-emitting chip.

FIG. 8 is a timing chart for explaining the operation of the light-emitting chip C1 (C). Note that, in FIG. 8, it is assumed that all of the four light-emitting thyristors L1 to L4 in the group #A shown in FIG. 7 are caused to light up, and the light-emitting thyristors L5, L7 and L8 among the four light-emitting thyristors L5 to L8 in the group #B are caused to light up. In addition, all of the light-emitting thyristors L9 to L16 in the groups #C and #D are caused to light up.

In FIG. 8, it is assumed that time elapses from a time point a to a time point z in alphabetical order. In a period T(#A) from a time point c to a time point p, in order to cause the four light-emitting thyristors L1 to L4 in the group #A shown in FIG. 7 to light up at the same time, the memory thyristors M1 to M4 are caused to be turned on and to memorize information on positions (numbers) of the light-emitting thyristors L1 to L4 (the memory step). Then, from a time point n to a time point r, the light-emitting thyristors L1 to L4 are caused to light up (emit light) (light-up step).

Next, in the period T(#B) from the time point p to a time point t, in order to cause the three light-emitting thyristors L5, L7 and L8 in the group #B to light up at the same time, the memory thyristors M5, M7 and M8 are caused to be turned on and to memorize information on positions (numbers) of the light-emitting thyristors L5, L7 and L8 (memory step). Then, in a period from a time point s to a time point u, the light-emitting thyristors L5, L7 and L8 are caused to light up (emit light) (light-up step).

Thereafter, the period T(#C) from the time point t to a time point w, and the period T(#D) from the time point w to the time point z follow, in a similar manner.

The first transfer signal φ1, the second transfer signal φ2 and the holding signal φb respectively have the same waveforms repeated in every period such as the period T(#A), the period T(#B) . . . . Meanwhile, the memory signal φm1 (φm) has a part changed on the basis of the image dataset, but the basic part thereof has the same waveform repeated in every period such as the period T(#A), the period T(#B) . . . .

The time point c of the period T(#A) corresponds to timing when the light-emitting chip C1 (C) goes into an operational state, and thus there is no light-emitting thyristor L that is lighting up (emitting light). Accordingly, the waveform of the light-up signal φI1 (φI) is different between in the period T(#A) and the period T(#B). However, in the period T(#B) and the subsequent period, the same waveform is repeated.

Therefore, a description will be given of the first transfer signal φ1, the second transfer signal φ2, the memory signal φm1 (φm) and the holding signal φb in the period T(#A) from the time point c to the time point p. A description will be additionally given of the light-up signal φI1 (φI). Note that, a period from the time point a to the time point c is a period (operation start period) for starting the operation of the light-emitting chip C1 (C).

The first transfer signal φ1 has a potential at a low level (hereinafter, referred to as "L") at the start time point c of the period T(#A), and the potential thereof is changed to the potential at a high level (hereinafter, referred to as "H") from "L" at a time point e, and then is changed from "H" to "L" at a time point g. Thereafter, the potential of the first transfer signal φ1 is changed from "L" to "H" at a time point k, and is changed from "H" to "L" at the time point n. The potential of "L" is maintained until the finish time point p of the period T(#A).

The second transfer signal φ2 has a potential of "H" at the start time point c of the period T(#A), and the potential thereof is changed from "H" to "L" at a time point d, and is changed from "L" to "H" at a time point h. Then, the potential of the second transfer signal φ2 is changed from "H" to "L" at a time point j, and is changed from "L" to "H" at a time point o. The potential of "H" is maintained until the finish time point p of the period T(#A).

Here, in a case where the first transfer signal φ1 and the second transfer signal φ2 are compared with each other, the first transfer signal φ1 and the second transfer signal φ2 each have the potential alternately repeating "H" and "L" with interposition of the period when both of the potentials thereof are "L" (for example, from the time point d to the time point e, or the time point g to the time point h), in the period from the time point c to the time point p. The period when the first transfer signal φ1 and the second transfer signal φ2 have the potential of "H" at the same time does not exist.

The potential of the memory signal φm1 (φm) is changed from "H" to "L" at the time point c of the period T(#A), and is changed from "L" to a potential at a memory level (hereinafter, referred to as "S") at the time point d. Note that, the memory level "S" indicates a potential between "H" and "L," and indicates a potential at which the ON state of the memory thyristor M having been turned on is maintainable, although the detailed description thereof will be given later.

Then, the potential of the memory signal φm1 (φm) is changed from "S" to "L" at a time point f, and is changed from "L" to "S" at the time point g. Thereafter, the potential thereof is changed from "S" to "L" at a time point i, changed from "L" to "S" at the time point j, changed from "S" to "L" at a time point 1 and changed from "L" to "H" at the time point n. At the finish time point p of the period T(#A), the potential of "H" is maintained. The memory signal φm has three levels, that is, "L," "S," and "H."

The memory signal φm1 (φm) has a potential of "L" when any one of the first transfer signal φ1 and the second transfer signal φ2 has the potential of "L." For example, in the period from the time point c to the time point d, during which the first transfer signal φ1 has the potential of "L," and in the period from the time point f to the time point g, during which the second transfer signal φ2 has the potential of "L," the potential of the memory signal φm1 (φm) is "L."

The potential of the holding signal φb is "H" at the start time point c of the period T(#A), and is changed from "H" to "L" at a time point m. Then, the potential thereof is changed from "L" to "H" at the time point o, and is maintained at "H" at the finish time point p of the period T(#A).

In the present exemplary embodiment, the light-up signal φI1 (φI) is a signal that supplies a current for light emission (light-up) to the light-emitting thyristors L, as described later.

The light-up signal φI has the potential of "H" at the start time point c of the period T(#A), and the potential thereof is changed from "H" to a potential at the light-up level (hereinafter, referred to as "Le") at the time point n. Note that, "Le" indicates a potential between "H" and "L," and indicates a potential at which the light-emitting thyristor L having the threshold voltage set to be high (being ready to light up) is ready to be turned on and to light up (emit light).

Then, the potential of the light-up signal φI is "Le" at the start time point p of the period T(#B). The potential thereof is changed from "Le" to "H" at the time point r, and is changed from "H" to "Le" at the time point s. The potential thereof is maintained at "Le" at the finish time point t of the period T(#B).

(Basic Operation of Thyristors)

Prior to describing the operation of the light-emitting chip C1 (C), the basic operation of the thyristors (transfer thyristors T, memory thyristors M, holding thyristors B and light-emitting thyristors L) will be described.

Hereinbelow, as described in FIG. 5, it is assumed that the reference potential Vsub supplied to the anode terminals of the thyristors set as the substrate 80 (Vsub terminals) is set at 0 V ("H"), and the power supply potential Vga supplied to the Vga terminals is set at −3.3 V ("L"), as an example. It is also assumed that the thyristors are configured of p-type semiconductor layers and n-type semiconductor layers, which are made of a compound semiconductor such as GaAs, GaAlAs or the like including gallium (Ga) and arsenicum (As), stacked on each other, as shown in FIG. 6B, and a diffusion potential (forward potential) Vd of the p-n junction is set at 1.5 V.

The thyristor is turned on when the lower potential than a threshold voltage (potential larger in negative values) is applied to the cathode terminal thereof. When being turned on (ON), the thyristor goes into a state (ON state) in which the current easily flows between the anode terminal and the cathode terminal thereof. Here, the threshold voltage of the thyristor is a value obtained by subtracting the diffusion potential Vd from the potential of the gate terminal. Accordingly, if the potential of the gate terminal of the thyristor is −1.5 V, the threshold voltage is −3 V. Therefore, the thyristor is turned on when the potential lower than −3 V is applied to the cathode terminal thereof.

Then, when the thyristor is turned on, the gate terminal of the thyristor has a potential equal to that of the anode terminal of the thyristor (0 V, here). Here, the cathode terminal of the thyristor has a potential equal to the diffusion potential Vd (−1.5 V, here).

If the thyristor is turned on, it is kept in the ON state until the potential of the cathode terminal becomes a potential higher than the potential necessary for keeping the thyristor in the ON state (potential smaller in negative values). For example, if the potential of the cathode terminal becomes 0 V ("H"), and becomes equal to the potential of the anode terminal, the thyristor is turned off (OFF). When being turned off, the thyristor goes into a state (OFF state) in which the current is difficult to flow between the anode terminal and the cathode terminal thereof.

Meanwhile, since the potential of the cathode terminal being in the ON state is −1.5 V, if the potential lower than −1.5 V is applied to the cathode terminal and the current with which the ON state is maintainable is supplied, the thyristor is kept in the ON state. The potential that keeps the thyristor in the ON state is lower than the potential for turning on the thyristor.

The thyristor may not be changed from the ON state to the OFF state by using the potential of the gate terminal. Thus, the thyristor has a function that keeps (holds, memorize) the thyristor in the ON state.

Note that, the light-emitting thyristor L uses light emission generated by turning on the thyristor.

With reference to FIG. 5, a description will be given of an operation of the light-emitting portion 63 and the light-emitting chip C1 in accordance with the timing chart shown in FIG. 8.

(Initial State)

At the time point a in the timing chart shown in FIG. 8, the Vsub terminals in the light-emitting chips C (C1 to C60) in the light-emitting portion 63 are set at the reference potential Vsub (0 V), and the Vga terminals thereof are set at the power supply potential Vga (−3.3 V) (see FIG. 4).

Further, the potentials of the first transfer signal φ1, the second transfer signal φ2 and the holding signal φb are set at "H," and the potentials of the memory signals φm (φm1 to φm60) and the light-up signals φI (φI1 to φI30) are set at "H."

Then, the potential of the first transfer signal line 106 becomes "H," and the first transfer signal line 72 of each light-emitting chip C becomes "H" through the φ1 terminal of each light-emitting chip C in the light-emitting portion 63. Similarly, the potential of the second transfer signal line 107 becomes "H," and the second transfer signal line 73 of each light-emitting chip C becomes "H" through the φ2 terminal of each light-emitting chip C. The potentials of the memory signal lines 108 (108_1 to 108_60) are set at "H," and the potential of the memory signal line 74 of each light-emitting chip C becomes "H" through the φm terminal of each light-emitting chip C. Further, the potential of the holding signal line 103 becomes "H," and the holding signal line 76 of each light-emitting chip C becomes "H" through the φb terminal of each light-emitting chip C. Furthermore, the potentials of the light-up signal lines 109 (109_1 to 109_30) are set at "H," and the light-up signal line 75 of each light-emitting chip C becomes "H" through the φI terminal of each light-emitting chip C.

Hereinbelow, the operation of the light-emitting chip C will be described by taking the light-emitting chip C1 as an example, since the light-emitting chips C1 to C60 are operated in parallel.

The potentials of the anode terminals of the transfer thyristors T, the memory thyristors M, the holding thyristors B and the light-emitting thyristors L become "H" (0 V).

The potentials of the first transfer signal line 72, the second transfer signal line 73, the memory signal line 74, the holding signal line 76, the light-up signal line 75, which are connected to the cathode terminals of the transfer thyristors T, the memory thyristors M, the holding thyristors B and the light-emitting thyristors L, respectively, are set at "H," and thus all of the anode terminals and the cathode terminals of the transfer thyristors T, the memory thyristors M, the holding thyristors B and the light-emitting thyristors L are "H." Accordingly, the transfer thyristors T, the memory thyristors M, the holding thyristors B and the light-emitting thyristors L are in the OFF state.

The gate terminals Gt of the transfer thyristors T are set at the power supply potential Vga ("L": −3.3 V) through the respective power supply line resistances Rt.

Similarly, the gate terminals Gm of the memory thyristors M are set at the power supply potential Vga ("L": −3.3 V) through the respective power supply line resistances Rm, and the gate terminals Gb of the holding thyristors B (and also the gate terminals Gl of the light-emitting thyristors L) are set at the power supply potential Vga ("L": −3.3 V) through the respective power supply line resistances Rb.

The gate terminal Gt1 located on the one end side of the transfer thyristor array in FIG. 5 is connected to the cathode terminal of the start diode Ds. The anode terminal of the start diode Ds is connected to the second transfer signal line 73 having the potential of "H." Thereby, the voltage in the forward direction is applied to the start diode Ds (forward bias). Thus, the gate terminal Gt1 to which the cathode terminal of the start diode Ds is connected has a value of −1.5 V, which is obtained by subtracting the diffusion potential Vd of the start diode Ds (1.5 V) from the potential "H" of the anode terminal of the start diode Ds (0 V). The threshold voltage of the transfer thyristor T1 becomes −3 V obtained by subtracting the diffusion potential Vd (1.5 V) from the potential of the gate terminal Gt1 (−1.5 V), as described in the above.

Note that, the gate terminal Gt2 of the transfer thyristor T2 adjacent to the transfer thyristor T1 is connected to the gate terminal Gt1 through the coupling diode Dc1, and thus the potential thereof becomes −3 V obtained by subtracting the diffusion potential Vd (1.5 V) of the coupling diode Dc1 from the potential of the gate terminal Gt1 (−1.5 V), and the threshold voltage of the transfer thyristor T2 becomes −4.5 V.

Further, the gate terminal Gt3 of the transfer thyristor T3 is to become −4.5 V in accordance with this calculation. However, since the potential thereof does not become a value lower than the power supply potential Vga (−3.3 V), the potential thereof is −3.3 V. In other words, each terminal does not have a potential lower than the power supply potential Vga (−3.3 V) in the present exemplary embodiment. The threshold voltage of the thyristor having the gate terminal set at the power supply potential Vga (−3.3 V) becomes −4.8 V.

Similarly, the gate terminal Gm1 of the memory thyristor M1 (and also the gate terminal Gt1 of the light-emitting thyristor L1) is connected to the gate terminal Gt1 through the connecting diode Dm1, and thus the potential thereof becomes −3 V obtained by subtracting the diffusion potential Vd of the connecting diode Dm1 (1.5 V) from the potential of the gate terminal Gt1 (−1.5 V). Accordingly, the threshold voltage of the memory thyristor M1 (light-emitting thyristor L1) becomes −4.5 V.

As described above, the potential of the gate terminal of the thyristor and the threshold voltage thereof may be obtained. Here, the thyristors each having the threshold voltage lower than the power supply potential Vga (−3.3 V) are not operated, and thus the description thereof will be omitted below.

(Start of Operation)

At a time point b, the potential of the first transfer signal φ1 is changed from "H" (0 V) to "L" (−3.3 V). Then, the transfer thyristor T1 having the threshold voltage of −3 V is turned on. The odd-numbered transfer thyristors T each having a number not less than 3 have the threshold voltage of −4.8 V, and thus they are not turned on. In addition, the transfer thyristor T2 is not turned on since the transfer thyristor T2 has the threshold voltage of −4.5 V and the potential of the first transfer signal φ1 is "H" (0 V).

When the transfer thyristor T1 is turned on, the potential of the gate terminal Gt1 becomes "H" (0 V) that is the potential of the anode terminal. Then, the potential of the cathode terminal of the transfer thyristor T1 (first transfer signal line 72) becomes −1.5 V obtained by subtracting the diffusion potential Vd (1.5 V) from the potential "H" of the anode terminal (0 V).

Thereby, the connecting diode Dc1 goes into a forward-biased state, and the potential of the gate terminal Gt2 becomes −1.5 V obtained by subtracting the diffusion potential Vd (1.5 V) of the coupling diode Dc1 from the potential of the gate terminal Gt1 (0 V). Thereby, the threshold voltage of the transfer thyristor T2 becomes −3 V.

However, since the potential of the second transfer signal φ2 is "H," the transfer thyristor T2 is not turned on.

When the transfer thyristor T1 is turned on and the potential of the gate terminal Gt1 becomes "H" (0 V), the connecting diode Dm1 goes into a forward-biased state. Thereby, the potential of the gate terminal Gm1 becomes −1.5 V, and the threshold voltage of the memory thyristor M1 becomes −3 V. However, since the potential of the memory signal φm1 (φm) is 0 V ("H"), the memory thyristor M1 is not turned on.

When the transfer thyristor T1 is turned on and the potential of the gate terminal Gt1 becomes "H" (0 V), the connecting diode Db1 also goes into a forward-biased state. The potentials of the gate terminals Gb1 and Gl1 connected to the gate terminal Gt1 through the connecting diodes Dm1 and Db1 being in the forward-biased state become −3 V. Thus, the threshold voltages of the holding thyristor B1 and the light-emitting thyristor L1 become −4.5 V. However, since both of the potentials of the holding signal φb and the light-up signal φI1 (φI) are 0 V ("H"), none of the holding thyristors B and the light-emitting thyristors L are turned on.

Accordingly, only the transfer thyristor T1 is in the ON state immediately after the time point b (indicating time after the change of the states of the thyristors and the like occurs in accordance with the potential change of the signals at the time point b).

(Operational State)

At the time point c, the potential of the memory signal φm1 (φm) changes from "H" (0 V) to "L" (−3.3 V). Thereby, the memory thyristor M1 having the threshold voltage of −3 V is turned on.

When the memory thyristor M1 is turned on, the potential of the gate terminal Gm1 becomes "H" (0 V), similarly to the case of the transfer thyristor T1. Thereby, the potentials of the gate terminals Gb1 and Gl1 connected to the gate terminal Gm1 through the connecting diode Db1 become −1.5 V, and the threshold voltages of the holding thyristor B1 and the light-emitting thyristor L1 become −3 V. However, since both of the potentials of the holding signal φb and the light-up signal φI1 (φI) are "H" (0 V), none of the holding thyristor B1 and the light-emitting thyristor L1 are turned on. Thus, the light-emitting thyristor L1 does not light up (emit light).

Accordingly, the transfer thyristor T1 and the memory thyristor M1 are kept in the ON state immediately after the time point c.

Note that, the potential of the cathode terminal of the memory thyristor M1 becomes −1.5 V obtained by subtracting the diffusion potential Vd (1.5 V) from "H" (0 V). However, the memory thyristor M1 is connected to the memory signal line 74 through the resistance Rn1. Thereby, the potential of the memory signal line 74 is maintained at "L" (−3.3 V).

At the time point d, the potential of the memory signal φm1 (φm) is changed from "L" to "S," and the potential of the second transfer signal φ2 is changed from "H" to "L."

"S" is a potential at which the memory thyristor M being in the OFF state is not turned on while the memory thyristor M being in the ON state is kept in the ON state.

As mentioned above, the threshold voltage of the memory thyristor M that is caused to be turned on at the time point c is −3 V. However, the potential of the cathode terminal of the memory thyristor M being in the ON state is −1.5 V. Thus, "S" is set at a potential that is higher than the threshold voltage (−3 V) for causing the memory thyristor M to be turned on and that is lower than the potential of the cathode terminal being in the ON state (−1.5 V) (−3V<"S"≤−1.5 V).

Accordingly, if the potential of the memory signal φm1 (φm) is changed from "L" to "S," the memory thyristor M1 being in the ON state is kept in the ON state.

Meanwhile, when the potential of the second transfer signal φ2 is changed from "H" to "L," the transfer thyristor T2 having the threshold voltage of −3 V is turned on.

When the transfer thyristor T2 is turned on, the potential of the gate terminal Gt2 is increased up to "H" (0 V). Then, the threshold voltage of the transfer thyristor T3 having the gate terminal Gt3 connected to the gate terminal Gt2 through the coupling diode Dc2 becomes −3 V. Similarly, the threshold voltage of the memory thyristor M2 having the gate terminal Gm2 (Gl2) connected to the gate terminal Gt2 through the connecting diode Dm2 becomes −3 V.

At this time, since the transfer thyristor T1 is kept in the ON state, the potential of the first transfer signal line 72 to which the cathode terminal of the transfer thyristor T3 is connected is −1.5 V. Thus, the transfer thyristor T3 is not turned on.

In addition, since the potential of the memory signal φm1 (φm) is "S," the memory thyristor M2 is not turned on, either.

Immediately after the time point d, both of the transfer thyristors T1 and T2 are in the ON state, and the memory thyristor M1 is kept in the ON state.

At the time point e, the potential of the first transfer signal φ1 is changed from "L" to "H." Thereby, both of the potentials of the cathode terminal and the anode terminal of the transfer thyristor T1 become "H," and thus the transfer thyristor T1 is turned off.

At this time, since the gate terminal Gt1 of the transfer thyristor T1 is connected to the power supply line 71 through the power supply line resistance Rt1, the potential thereof becomes −3.3 V that is the power supply potential Vga. Meanwhile, the gate terminal Gt2 has a potential of 0 V. Accordingly, the coupling diode Dc1 goes into a reversely-biased state, and thus the potential "H" (0 V) of the gate terminal Gt2 does not affect the gate terminal Gt1.

Specifically, the potential of the gate terminal connected to the gate terminal having the potential of "H" (0 V) through the reversely-biased diode is not affected by the gate terminal having the potential of "H" (0 V). Thus, the description thereof will be omitted below.

Immediately after the time point e, the transfer thyristor T2 and the memory thyristor M1 are kept in the ON state.

Next, when the potential of the memory signal φm1 (φm) is changed from "S" to "L" (−3.3 V) at the time point f, the memory thyristor M2 having the threshold voltage of −3 V is newly turned on (which is shown as +M2 on in FIG. 8). In other words, in addition to the memory thyristor M1 having been in the ON state, the memory thyristor M2 goes into the ON state. Thereby, the potential of the gate terminal Gm2 becomes "H" (0 V), and the potentials of the gate terminals Gb2 and G12 connected thereto through the connecting diode Db2 become −1.5 V. Thereby, the threshold voltages of the holding thyristor B2 and the light-emitting thyristor L2 become −3 V. However, since both of the potentials of the holding signal φb and the light-up signal φI1 (φI) are "H" (0 V), none of the holding thyristor B2 and the light-emitting thyristor L2 are turned on. Thus, the light-emitting thyristor L2 does not light up (emit light).

Accordingly, immediately after the time point f, the transfer thyristor T1 and the memory thyristors M1 and M2 are kept in the ON state.

At the time point g, the potential of the memory signal φm1 (φm) is changed from "L" to "S," and the potential of the first transfer signal φ1 is changed from "H" to "L."

Even when the potential of the memory signal φm1 (φm) is changed from "L" to "S," the memory thyristors M1 and M2 being in the ON state are kept in the ON state.

Meanwhile, when the potential of the first transfer signal φ1 is changed from "H" to "L," the transfer thyristor T3 having the threshold voltage of −3 V is turned on. Then, the potential of the gate terminal Gt3 becomes "H" (0 V), and the threshold voltage of the transfer thyristor T4 connected to the gate terminal Gt3 through the coupling diode Dc3 becomes −3 V. Similarly, the threshold voltage of the memory thyristor M3 connected to the gate terminal Gt3 through the connecting diode Dm3 becomes −3 V.

At this time, the transfer thyristor T2 is kept in the ON state. Thereby, the potential of the second transfer signal line 73 to which the cathode terminal of the transfer thyristor T2 is connected is maintained at −1.5 V, and thus the transfer thyristor T4 is not turned on.

In addition, since the potential of the memory signal φm1 (φm) is "S," the memory thyristor M3 is not turned on.

Immediately after the time point g, both of the transfer thyristors T2 and T3 are in the ON state, and the memory thyristors M1 and M2 are also kept in the ON state.

Then, at the time point h, the potential of the second transfer signal φ2 is changed from "L" to "H." Thereby, the transfer thyristor T2 is turned off similarly to the case at the time point e. The gate terminal Gt2 of the transfer thyristor T2 becomes −3.3 V that is the power supply potential Vga, through the power supply line resistance Rt2.

Immediately after the time point h, the transfer thyristor T3 and the memory thyristors M1 and M2 are kept in the ON state.

When the potential of the memory signal φm1 (φm) is changed from "S" to "L" (−3.3 V) at the time point i, the memory thyristor M3 having the threshold voltage of −3 V is turned on, similarly to the case at the time point f. Thereby, the potential of the gate terminal Gm3 becomes "H" (0 V), and thus the potentials of the gate terminals Gb3 and Gl3 connected to the gate terminal Gm3 through the connecting diode Db3 become −1.5 V, and the threshold voltages of the holding thyristor B3 and the light-emitting thyristor L3 become −3 V. However, since both of the potentials of the holding signal φb and the light-up signal φI1 (φI) are "H" (0 V), none of the holding thyristor B3 and the light-emitting thyristor L3 are turned on. Thus, the light-emitting thyristor L3 does not light up (emit light).

Accordingly, immediately after the time point i, the transfer thyristor T3 and the memory thyristors M1, M2 and M3 are kept in the ON state.

At the time point j, the potential of the memory signal φm1 (φm) is changed from "L" to "S," and the potential of the second transfer signal φ2 is changed from "H" to "L."

Thereby, similarly to the case at the time point g, the memory thyristors M1, M2 and M3 being in the ON state are kept in the ON state.

When the potential of the second transfer signal φ2 is changed from "H" to "L," the transfer thyristor T4 having the threshold voltage of −3 V is turned on. Thereby, the potential of the gate terminal Gt4 becomes "H" (0 V), and the threshold voltage of the transfer thyristor T5 connected to the gate terminal Gt4 through the coupling diode Dc4 becomes −3 V. Similarly, the threshold voltage of the memory thyristor M4 connected to the gate terminal Gt4 through the connecting diode Dm4 becomes −3 V.

At this time, since the transfer thyristor T3 is kept in the ON state, the potential of the first transfer signal line 72 to which the cathode terminal of the transfer thyristor T5 is connected is maintained at −1.5 V by the transfer thyristor T3 being in the ON state. Accordingly, the transfer thyristor T5 is not turned on.

In addition, since the potential of the memory signal φm1 (φm) is "S," the memory thyristor M4 is not turned on.

Accordingly, immediately after the time point j, both of the transfer thyristors T3 and T4 are in the ON state, and the memory thyristors M1, M2 and M3 are kept in the ON state.

At the time point k, the potential of the first transfer signal φ1 is changed from "L" to "H." Thereby, the transfer thyristor T3 is turned off similarly to the case at the time point h. Further, the gate terminal Gt3 of the transfer thyristor T3 becomes −3.3 V that is the power supply potential Vga, through the power supply line resistance Rt3.

Accordingly, immediately after the time point k, the memory thyristors M1, M2 and M3 and the transfer thyristor T4 are kept in the ON state.

When the potential of the memory signal φm1 (φm) is changed from "S" to "L" at the time point l, the transfer thyristor M4 having the threshold voltage of −3 V is turned on similarly to the case at the time point i. Thereby, the potential of the gate terminal Gm4 becomes "H" (0 V), and thus the potentials of the gate terminals Gb4 and Gl4 connected to the gate terminal Gm4 through the connecting diode Db4 become −1.5 V, and the threshold voltages of the holding thyristor B4 and the light-emitting thyristor L4 become −3 V. However, since both of the potentials of the holding signal φb and the light-up signal φI1 (φI) are "H" (0 V), none of the holding thyristor B4 and the light-emitting thyristor L4 are turned on. Thus, the light-emitting thyristor L4 does not light up (emit light).

Immediately after the time point l, the transfer thyristor T4 and the memory thyristors M1, M2, M3 and M4 are in the ON state. In other words, in the period T(#A), by setting the memory thyristors M1, M2, M3 and M4 corresponding to the respective light-emitting thyristors L1, L2, L3 and L4 to be caused to light up to go into the ON state, information on the positions (numbers) of the light-emitting thyristors L1, L2, L3 and L4 to be caused to light up is memorized in the memory thyristors M.

Further, the memory thyristors M1, M2, M3 and M4 are in the ON state, and all of the gate terminals Gm1, Gm2, Gm3 and Gm4 are "H" (0 V). Thus, all of the threshold voltages of the holding thyristors B1, B2, B3 and B4 and the light-emitting thyristors L1, L2, L3 and L4, which are connected to the respective gate terminals Gm1, Gm2, Gm3 and Gm4 through the respective connecting diodes Db1, Db2, Db3 and Db4, are −3 V.

At the time point m, the potential of the holding signal φb is changed from "H" to "L" (−3.3 V). Thereby, the holding thyristors B1, B2, B3 and B4, which have the threshold voltages of −3 V, are turned on.

Note that, the holding thyristors B are connected to the holding signal line 76 through the respective resistances Rc. Accordingly, even if the one holding thyristor B becomes in the ON state, and the potential of the cathode terminal thereof becomes −1.5 V, the potential of the holding signal line 76 is maintained at "L" (−3.3 V). Thus, all of the plural holding thyristors B (holding thyristors B1, B2, B3 and B4, here), which have the threshold voltages higher than "L," may be turned on.

When the holding thyristors B1, B2, B3 and B4 are turned on, the potentials of the gate terminals Gb1, Gb2, Gb3 and Gb4 thereof become "H" (0 V). The gate terminals Gb1, Gb2, Gb3 and Gb4 are respectively connected to the gate terminals Gl1, Gl2, Gl3 and Gl4, and thus the threshold voltages of the light-emitting thyristors L1, L2, L3 and L4 become −1.5 V.

At the time point n, the potential of the memory signal φm1 (φm) is changed from "L" to "H." Thereby, all of the memory thyristors M1, M2, M3 and M4 kept in the ON state are turned off. Accordingly, the information on the positions (numbers) of the light-emitting thyristors L intended to light up (1, 2, 3, 4) is lost from the memory thyristors M.

However, since the holding thyristors B1, B2, B3 and B4 are turned on, and the information on the positions (numbers) of the light-emitting thyristors L intended to light up (1, 2, 3, 4) is held therein, it is acceptable that the information on the positions (numbers) of the light-emitting thyristors L intended to light up is lost from the memory thyristors M. In other words, the holding thyristors B have a function that receives and holds the information on the positions (numbers) of the light-emitting thyristors L intended to light up, the information having been memorized in the memory thyristors M.

When the potential of the light-up signal φI1 (φI) is changed from "H" to "Le" at the time point n, the light-emitting thyristors L1, L2, L3 and L4, which have the threshold voltages of −1.5 V, are turned on and light up (emit light).

The light-up level "Le" is determined so that the light-emitting thyristor L having the same number as the memory thyristor M being in the ON state and having a number not less than 5 is not caused to light up (emit light) when the memory thyristor M having the number not less than 5 becomes in the ON state in a period from the time point n to the time point r during which the light-emitting thyristors L1, L2, L3 and L4 are caused to light up. As mentioned above, the threshold voltage of the light-emitting thyristor L having the same number as the memory thyristor M being in the ON state is −3 V. Accordingly, the light-up level "Le" is set lower than −1.5 V that is the threshold voltage of the light-emitting thyristors L1 to L4 and higher than −3V (3V<"Le"≤=1.5 V).

Note that, the light-emitting thyristors L are connected to the light-up signal line 75 without resistances. However, since the light-up signal φI1 is driven with a current, the light-emitting thyristors L1, L2, L3 and L4 are ready to be turned on even without the resistances. In the present exemplary embodiment, plural light-emitting thyristors L (4 light-emitting thyristors L, here) are caused to light up at the same time.

Note that, in the present exemplary embodiment, "lighting-up thereof at the same time" indicates a state in which the light-emitting thyristor L having the threshold voltage higher than "Le" lights up by changing the potential of the light-up signal φI1 (φI) from "H" to "Le." At this time, as mentioned above, the number of the light-emitting thyristors L may be plural.

Also at the time point n, the potential of the first transfer signal φ1 is changed from "H" to "L" (−3.3 V), and the transfer thyristor T5 having the threshold voltage of −3 V is caused to be turned on.

Accordingly, immediately after the time point n, the transfer thyristors T4 and T5 and the holding thyristors B1, B2, B3 and B4 are in the ON state, and the light-emitting thyristors L1 to L4 are in a light-up (ON) state.

When the potential of the holding signal φb is changed from "L" to "H" at the time point o, the holding thyristors B1 to B4, which are in the ON state, are turned off. Thereby, the information on the positions (numbers) of the light-emitting thyristors L intended to light up (1, 2, 3, 4) is lost. However, since the light-emitting thyristors L1 to L4 have already been caused to light up in the time point n prior to the point o, it is acceptable that the information on the positions (numbers) of the light-emitting thyristors L intended to light up is lost from the holding thyristors B.

At the time point o, by changing the potential of the second transfer signal φ2 from "L" to "H," the transfer thyristor T4 is turned off.

Accordingly, immediately after the time point o, the transfer thyristor T5 is in the ON state, and the light-emitting thyristors L1 to L4 are kept in the light-up (ON) state.

When the potential of the memory signal φm is changed from "H" to "L" at the start time point p of the period T(#B), the memory thyristor M5 having the threshold voltage of −3 V is turned on. Thereby, the potential of the gate terminal Gb5 of the holding thyristor B5 (and also the potential of the gate terminal Gl5 of the light-emitting thyristor L5) becomes −1.5 V. Further, the threshold voltages of the holding thyristor B5 and the light-emitting thyristor L5 become −3 V.

Note that, the light-up signal φI1 (φI) is set at "Le" at the time point p. However, since "Le" is the potential higher than −3 V as mentioned above, the light-emitting thyristor L5 is not turned on and is kept in the OFF state (state in which the light-emitting thyristor L5 is out).

Then, in a period until a time point q, the memory thyristors M7 and M8 are caused to be turned on similarly to the case described in the period T(#A). Note that, in order to prevent the light-emitting thyristor L6 from lighting up (being turned on), the potential of the memory signal φm1 (φm) is maintained at "S" even at the timing when the memory thyristor M6 is turned on, and accordingly the memory thyristor M6 is not turned on.

Then, at the time point r, the potential of the light-up signal φI1 (φI) is changed from "Le" to "H." Thereby, the light-emitting thyristors L1, L2, L3 and L4 are turned off and put out.

Thereafter, the operation similar to the above-described one is repeated.

As described above, in the present exemplary embodiment, in order to cause the four light-emitting thyristors L1 to L4 in the group #A to light up at the same time in the period T(#A), the memory thyristors M1 to M4 are caused to be turned on to memorize the information on the positions (numbers) of the light-emitting thyristors L1 to L4. In order to cause the three light-emitting thyristors L5, L7 and L8 in the group #B to light up at the same time in the next period T(#B), the memory thyristors M5, M7 and M8 are caused to be turned on to memorize the information on the positions (numbers) of the light-emitting thyristors L5, L7 and L8.

The light-emitting thyristors L1 to L4 are caused to light up (emit light) at the same time in a period from the time point n of the period T(#A) to the time point r of the period T(#B).

Specifically, the step (memory step) in which the light-emitting thyristors L to be intended to light up in the next group are designated and memorized and the step (light-up step) in which the designated light-emitting thyristors L in the previous group are caused to light up are performed at the same time. Thereby, a ratio of the light emission period (light-emission duty) is increased.

In order to increase the light-emission duty, the holding thyristors B are provided between the memory thyristors M and the light-emitting thyristors L, and the light-emitting thyristors L are prevented from being turned on by the memory thyristors M going into the ON state.

Note that, as described above, the first transfer signal φ1, the second transfer signal φ2 and the holding signal φb are sharably supplied to the light-emitting chips C (C1 to C60), and the light-emitting chips C (C1 to C60) are operated in parallel. Further, the memory thyristors φm (φm1 to φm60), which designate the light-emitting thyristors L to be intended to light up, are individually supplied to the light-emitting chips C (C1 to C60) on the basis of the image dataset. Furthermore, each of the light-up signals φI (φI1 to φI30) is sharably supplied to the corresponding pair formed of two of the light-emitting chips C (C1 to C60). The light-up signal φI supplies a current with current driving in one light emission period (for example, a period from the time point n to the time point r in FIG. 8) in accordance with the number of the light-emitting thyristors L to be caused to light up among the two light-emitting chips C belonging to the pair. In one light emission period, the number of the light-emitting thyristors L to be caused to light up has been figured out by the image dataset. Thus, it is easy to set the current for the light-up signal φI in accordance with the number of the light-emitting thyristors L to be caused to light up.

In the present exemplary embodiment, plural light-emitting thyristors L are caused to light up at the same time in each light-emitting chip C, and the writing time to the photoconductive drum 12 by the print head 14 using the light-emitting portion 63 may be shortened since the light-emission duty is high.

As described above, in the present exemplary embodiment, the transfer thyristors T, the memory thyristors M, the holding thyristors B and the light-emitting thyristors L are used. By this configuration, as shown in FIG. 6, it is feared that the number of the wirings (upper wirings) is increased, and the width of the light-emitting chips C may be increased.

(Lower Wiring)

FIG. 9A is a plane view for explaining the structure of the lower wiring 200 (power supply line 71) that uses the stacked semiconductor layers in this exemplary embodiment in more detail. FIG. 9B is a cross-sectional view of FIG. 9A taken along a line IXB-IXB. Here, since the lower wiring 200 is schematically shown, the illustrations thereof do not correspond to those in FIGS. 6A and 6B.

As shown in FIG. 9A, on the lower wiring 200, the upper wirings 210 are provided through an isolation layer 85 (see FIG. 9B). Some parts of the upper wirings 210 are connected to the p-type electrode 135 through respective through holes (openings) Q provided by removing the isolation layer 85. Other parts of the upper wirings 210 are connected to islands 150 through respective through holes Q. Here, the description thereof will be given without individually discriminating the islands 150, unlike the description in FIG. 6A. Also, the description thereof will be given without individually discriminating the upper wirings 210.

Note that, as described in FIGS. 6A and 6B, the n-type electrode is provided on the fourth n-type semiconductor layer 84 in a case where the uppermost layer of the island 150 is the fourth n-type semiconductor layer 84, although the detailed description thereof will be omitted. Similarly, in a case where the uppermost layer of the island 150 is the third p-type semiconductor layer 83, the p-type electrode 135 is provided on the third p-type semiconductor layer 83. Each upper wiring 210 is connected to any one of the n-type electrode and the p-type electrode 135 thorough the corresponding through hole Q.

As shown in FIG. 9B, the lower wiring 200 using the stacked semiconductor layers includes the first p-type semiconductor layer 81 stacked on the substrate 80 that is the p-type semiconductor, the second n-type semiconductor layer 82 stacked on the first p-type semiconductor layer 81, the third p-type semiconductor layer 83 stacked on the second n-type semiconductor layer 82 and the p-type electrode 135 made of a material being in ohmic contact with the third p-type semiconductor layer 83.

The lower wiring 200 includes the p-type electrode 136 made of a material being in ohmic contact with a p-type semiconductor layer as an example of a second metallic layer, on the exposed first p-type semiconductor layer 81, although the illustration thereof is not shown in FIG. 6B. Further, the lower wiring 200 includes a shorting wiring 126 as an example of a first metallic layer made of a material being in ohmic contact with the n-type semiconductor layer so that the shorting wiring 126 connects the p-type electrode 136 and the exposed second n-type semiconductor layer 82. The shorting wiring 126 functions as also an n-type electrode for the second n-type semiconductor layer 82. In other words, the shorting wiring 126 is formed above the first p-type semiconductor layer 81 while the p-type electrode 136 is interposed therebetween. Further, the shorting wiring 126 is directly formed on the second n-type semiconductor layer 82. Note that, since both of the shorting wiring 126 and the p-type electrode 136 are made of a metallic material, they obtain the ohmic contact.

In addition, in FIG. 9B, the isolation layer 85, the through holes Q provided in the isolation layer 85 and the upper wirings 210 are included.

Next, an operation of the lower wiring 200 will be described.

In the present exemplary embodiment, a back-side common electrode that is a Vsub terminal is formed on the backside of the substrate 80, and the reference potential Vsub (0 V) is supplied thereto. Thereby, the potential of the first p-type semiconductor layer 81 is the reference potential Vsub (0 V). Meanwhile, the power supply potential Vga (−3.3 V) is supplied to the p-type electrode 135. Thereby, the potential of the third p-type semiconductor layer 83 is the power supply potential Vga (−3.3 V).

Further, the first p-type semiconductor layer 81 and the second n-type semiconductor layer 82 have the same potential since they are connected by the shorting wiring 126. Thus, a potential difference between the reference potential Vsub (0 V) and the power supply potential Vga (−3.3 V) is applied to a p-n junction between the second n-type semiconductor layer 82 and the third p-type semiconductor layer 83. At this time, the p-n junction between the second n-type semiconductor layer 82 and the third p-type semiconductor layer 83 is reversely biased, and thus the potential difference between the reference potential Vsub (0 V) and the power supply potential Vga (−3.3 V) is held by a depletion layer formed by the p-n junction. The withstand voltage (breakdown voltage) of the reversely-biased p-n junction formed by stacking the p-type semiconductor layer and the n-type semiconductor layer made of a compound semiconductor such as GaAs, GaAlAs or the like is larger than the potential difference between the reference potential Vsub (0 V) and the power supply potential Vga (−3.3 V). Thus, the potential of the p-type electrode 135 formed on the third p-type semiconductor layer 83 is maintainable at the power supply potential Vga (−3.3 V).

As described above, in the lower wiring 200 using the stacked semiconductor layers, it is only necessary that the potential of semiconductor layer (the second n-type semiconductor layer 82) between the substrate 80 that is the p-type semiconductor and the third p-type semiconductor layer 83 is fixed so that any one of the p-n junction between the substrate 80 that is the p-type semiconductor and the third p-type semiconductor layer 83 is reversely biased with respect to the potentials applied to the substrate 80 that is the p-type semiconductor and the third p-type semiconductor layer 83 that is the uppermost layer of the stacked semiconductor layers.

Note that, in the present exemplary embodiment, the third p-type semiconductor layer 83 and the p-type electrode 135 provided thereon have the same potential. Accordingly, it may be considered that the third p-type semiconductor layer 83 and the p-type electrode 135 integrally work as a wiring. Here, the first p-type semiconductor layer 81, the second n-type semiconductor layer 82, the third p-type semiconductor layer 83 and the p-type electrode 135 in addition to the substrate 80 in the eighth island 148 are collectively called the lower wiring 200.

Note that, in a case where the second n-type semiconductor layer 82 and the first p-type semiconductor layer 81 do not have the same potential for not providing the shorting wiring 126, the potential of the second n-type semiconductor layer 82 goes into an unstable state (floating state). Then, a pnp transistor formed of the first p-type semiconductor layer 81, the second n-type semiconductor layer 82 and the third p-type semiconductor layer 83 may be operated by a noise or the like, and accordingly the power supply potential Vga (−3.3 V) of the p-type electrode 135 (power supply line 71) may be changed. Thereby, the operation of the light-emitting chips C is made unstable.

Note that, in order to fix the potentials of the semiconductor layers, it is necessary to obtain a good ohmic contact with the semiconductor layer. As a material being in ohmic contact with the p-type semiconductor layer in the compound semiconductor such as GaAs, GaAlAs or the like including Ga and As, Au including Zn (AuZn) may be appropriate. On the other hand, as a material being in ohmic contact with the n-type semiconductor layer, Au including Ge (AuGe) may be appropriate.

Note that, AuZn is used for the p-type electrode 135 of the lower wiring 200, as mentioned above. In this case, the p-type electrode 135 and the third p-type semiconductor layer 83 work as the power supply line 71. However, this power supply line 71 has a higher resistance than the upper wirings 210 using Al or Al alloy.

The power supply line 71 is connected to the gate terminals Gt of the transfer thyristors T, the gate terminals Gm of the memory thyristors M, the gate terminals Gb of the holding thyristors B and the gate terminals Gl of the light-emitting thyristors L through the respective power supply resistances Rt, Rm and Rb, as shown in FIGS. 5 and 6A. As mentioned above, the power supply line 71 has a function that sets the potentials of the gate terminals Gt, Gm, Gb and Gl to be changed from "H" (0 V) to "L" (power supply potential Vga (−3.3 V)) when the transfer thyristors T, the memory thyristors M, the holding thyristors B and the light-emitting thyristors L are turned off. Accordingly, it is not necessary that a large current flows into the power supply line 71, unlike the current for causing the light-emitting thyristors L to light up (emit light). Thus, the power supply line 71 is usable even when the resistance thereof is high.

(Manufacturing Method of Light-Emitting Chips)

The light-emitting chips C are manufactured as follows.

The first p-type semiconductor layer 81, the second n-type semiconductor layer 82, the third p-type semiconductor layer 83 and the fourth n-type semiconductor layer 84 are sequentially stacked on the substrate 80 that is the p-type semiconductor, and then etching is performed from the surface of the fourth n-type semiconductor layer 84 to the p-type substrate 80, in order to form plural islands having a mesa structure (see FIGS. 6A and 6B).

Thereafter, in the eighth island 148 forming the lower wiring 200, the surface of the first p-type semiconductor layer 81 is exposed, and the region for forming the p-type electrode 136 is formed (see FIG. 9B).

Next, in the eighth island 148, the surface of the second n-type semiconductor layer 82 is also exposed, and the region for forming the shorting wiring 126 is formed (see FIG. 9B).

Then, the surface of the third p-type semiconductor layer 83 is exposed, and regions for forming the gate terminals Gt, Gm, Gb and Gl, the power supply line resistances Rt, Rm and Rb, the resistances Rn and Rc, the current limitation resistances R1 and R2, the anode terminals of the coupling diodes Dc and the connecting diodes Dm and Db, and the p-type electrode 135 are formed (see FIG. 6B).

Then, on the exposed first p-type semiconductor layer 81 and third p-type semiconductor layer 83, the respective p-type electrodes (including the p-type electrodes 135 and 136) made of a material being in ohmic contact with the p-type semiconductor layer are formed by a liftoff technique. Similarly, on the exposed second n-type semiconductor layer 82 and the p-type electrode 136, the shorting wiring 126 and the n-type electrode made of a material being in ohmic contact with the n-type semiconductor layer are formed by the liftoff technique (see FIG. 9B).

Further, the isolation layer 85 is formed on the whole surface of the substrate 80, and the through holes Q are formed at predetermined positions on the n-type electrodes and p-type electrodes.

Furthermore, the upper wirings 210 are formed (see FIG. 9B).

In the manufacturing method shown here, the n-type electrode and the shorting wiring 126 may be simultaneously formed.

(Another Configuration of Lower Wiring)

Figure 10:
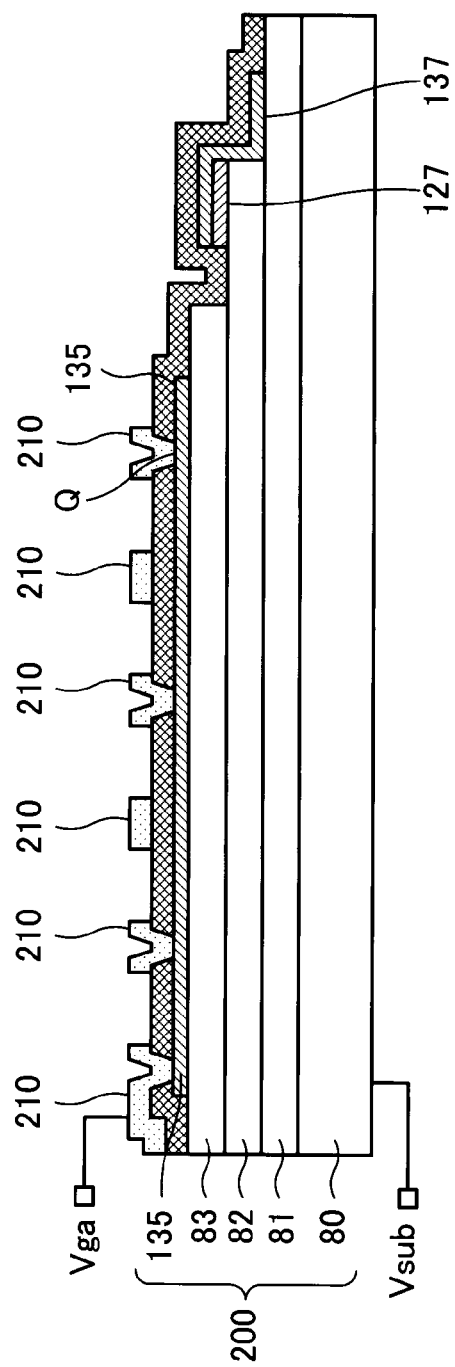
FIG. 10 is a cross-sectional view for explaining another configuration of the lower wiring using the stacked semiconductor layers.

FIG. 10 is a cross-sectional view for explaining another configuration of the lower wiring 200 (power supply line 71) using the stacked semiconductor layers. The difference from the lower wiring 200 shown in FIG. 9B is a shorting wiring 137 made of a material being in ohmic contact with the p-type semiconductor layer in the lower wiring 200 shown in FIG. 10. Thus, on the second n-type semiconductor layer 82, an n-type electrode 127 made of a material being in ohmic contact with the n-type semiconductor layer is provided.

In other words, the shorting wiring 137 is directly formed on the first p-type semiconductor layer 81. In addition, the shorting wiring 137 is formed above the second n-type semiconductor layer 82 while the n-type electrode 127 is interposed therebetween.

This configuration example may be achieved by forming the shorting wiring 137 made of a material being in ohmic contact with the p-type semiconductor layer in the above-mentioned manufacturing method.

FIG. 11A is a plane view for explaining further configuration of the lower wiring 200 (power supply line 71) using the stacked semiconductor layers. FIG. 11B is a cross-sectional view of FIG. 11A taken along a line XIB-XIB. The difference between the lower wiring 200 shown in FIGS. 11A and 11B and the lower wiring 200 shown in FIGS. 9A and 9B is the shorting wiring 126 and the p-type electrode 136 which are provided so as to extend in the longitudinal direction of the eighth island 148 (the right-and-left direction in FIGS. 11A and 11B). Thereby, the potential of the second n-type semiconductor layer 82 is more stably fixed. Note that, the second n-type semiconductor layer 82 is processed so as to be exposed in the longitudinal direction of the eighth island 148.

This configuration may be manufactured by the above-mentioned manufacturing method of the light-emitting chips C.

Note that, this configuration may be applied to the configuration shown in FIG. 10.

FIG. 12A is a plane view for explaining the configuration of the lower wiring 200 (power supply line 71) using the stacked semiconductor layers, which has a reduced resistance. FIG. 12B is a cross-sectional view of FIG. 12A taken along a line XIIB-XIIB. The difference between the lower wiring 200 shown in FIGS. 12A and 12B and the lower wiring 200 shown in FIGS. 9A and 9B is a configuration in which through holes Q are provided at portions of the lower wiring 200 (on the p-type electrode 135) where the upper wirings 210 are not to be provided, and the upper wirings 210 are overlapped with the lower wiring 200 so as to cover the through holes Q. The upper wiring 210 covering the through hole Q reduces the resistance of the lower wiring 200.

Note that, in FIGS. 12A and 12B, an elongated through hole Q is provided on the p-type electrode 135 along the p-type electrode 135 in the longitudinal direction of the eighth island 148, and then the upper wiring 210 is formed so as to cover the through hole Q. Alternatively, plural through holes Q may be provided and the upper wiring 210 may be formed so as to connect the plural through holes Q.

This configuration may be manufactured by the above-mentioned manufacturing method of the light-emitting chips C.

Figure 13:
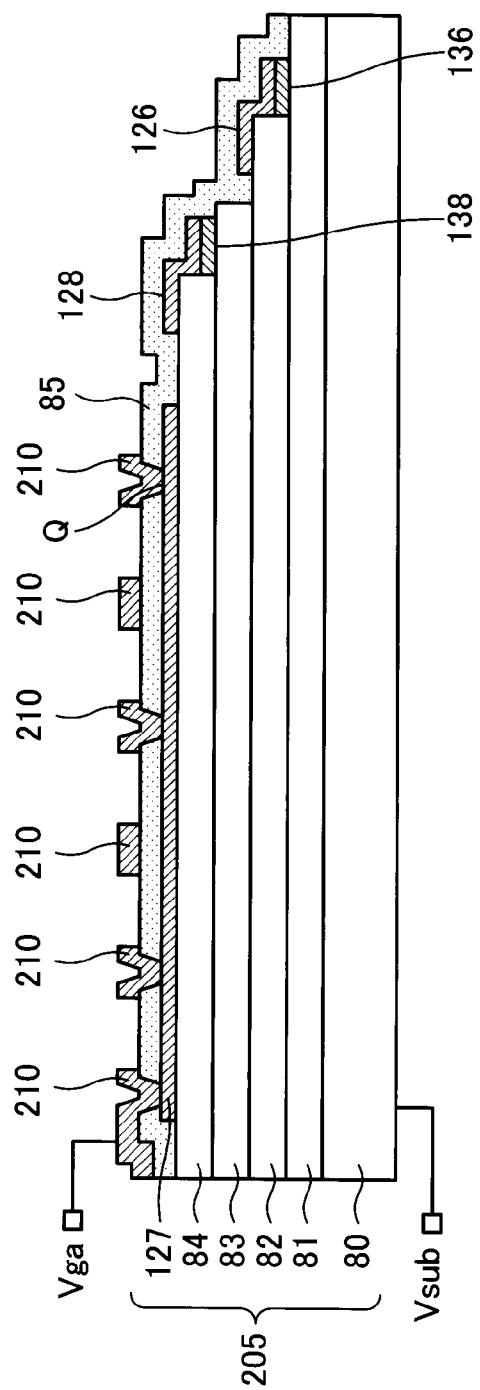
FIG. 13 is a cross-sectional view for explaining the lower wiring using the stacked semiconductor layers having 4 layers.

FIG. 13 is a cross-sectional view for explaining a lower wiring 205 (power supply line 71) using the stacked semiconductor layers having 4 layers.

The lower wiring 200 having been described above is configured by the p-type electrode 135 and the stacked semiconductor layers having 3 layers formed of the first p-type semiconductor layer 81 stacked on the substrate 80 that is the p-type semiconductor, the second n-type semiconductor layer 82 stacked on the first p-type semiconductor layer 81, and the third p-type semiconductor layer 83 stacked on the second n-type semiconductor layer 82.

The lower wiring 205 shown in FIG. 13 is configured of stacked semiconductor layers including 4 layers formed of the first p-type semiconductor layer 81 stacked on the substrate 80 that is the p-type semiconductor, the second n-type semiconductor layer 82 stacked on the first p-type semiconductor layer 81, the third p-type semiconductor layer 83 stacked on the second n-type semiconductor layer 82 and the fourth n-type semiconductor layer 84 stacked on the third p-type semiconductor layer 83, and the n-type electrode 127 provided on the fourth n-type semiconductor layer 84.

In FIG. 13, a p-type electrode 138 on the third p-type semiconductor layer 83 is newly provided, in addition to the p-type electrode 136 shown in FIGS. 9A and 9B. Further, a shorting wiring 128 configured by straddling the p-type electrode 138 and the fourth n-type semiconductor layer 84 provided on the third p-type semiconductor layer 83 is newly provided, in addition to the shorting wiring 126 shown in FIGS. 9A and 9B.

If the potentials of the first p-type semiconductor layer 81 and the fourth n-type semiconductor layer 84 are set as the reference potential Vsub (0 V) and the power supply potential Vga (−3.3 V), respectively, the first p-type semiconductor layer 81 and the second n-type semiconductor layer 82 have the same potential, and the third p-type semiconductor layer 83 and the fourth n-type semiconductor layer 84 have the same potential. Thereby, the p-n junction between the second n-type semiconductor layer 82 and the third p-type semiconductor layer 83 is reversely biased, and thus the potential difference between the reference potential Vsub (0 V) and the power supply potential Vga (−3.3 V) is held. Accordingly, the potential of the lower wiring 205 may be stable.

In other words, in the lower wiring 205 using the stacked semiconductor layers, it is only necessary that the potentials of the semiconductor layers (the second n-type semiconductor layer 82 and the third p-type semiconductor layer 83) between the substrate 80 that is a p-type semiconductor and the fourth n-type semiconductor layer 84 are fixed so that any one of the p-n junctions between the substrate 80 that is the p-type semiconductor and the fourth n-type semiconductor layer 84 is reversely biased with respect to the potentials applied to the substrate 80 that is the p-type semiconductor and the fourth n-type semiconductor layer 84 that is an uppermost layer of the stacked semiconductor layers.

Note that, the configuration shown in FIG. 13 may be manufactured by slightly changing the above-mentioned manufacturing method of the light-emitting chips C.

Note that, in a case where the potentials of the second n-type semiconductor layer 82 and the third p-type semiconductor layer 83 are not fixed for not providing the shorting wirings 126 and 128, the potentials of the second n-type semiconductor layer 82 and the third p-type semiconductor layer 83 go into an unstable state (floating state). Then, it is feared that a pnpn thyristor formed by the first p-type semiconductor layer 81, the second n-type semiconductor layer 82, the third p-type semiconductor layer 83 and the fourth n-type semiconductor layer 84 may go into the ON state (may be latched up) by a noise or the like, and the power supply potential Vga (−3.3 V) of the n-type electrode 127 (power supply line 71) may be changed. Thereby, the operation of the light-emitting chips C may be unstable.

As described above, by fixing the potentials of the semiconductor layers of the stacked semiconductor layers so that any one of the p-n junctions in the stacked semiconductor layers forming the lower wiring is reversely biased, the stabilization of the potential of the lower wiring may be improved. The method of fixing the potentials of the semiconductors of the stacked semiconductor layers is not limited to that shown in the present exemplary embodiment. Further, polarities of the potentials applied to the substrate of the stacked semiconductor layers configuring the lower wiring and the semiconductor layer as the uppermost layer may be changeable by changing the method of fixing the potentials of the semiconductors of the stacked semiconductor layers.

In the present exemplary embodiment, the description has been given of the self-scanning light-emitting element array (SLED) shown in FIG. 5. However, it is applicable to a SLED having another configuration such as a configuration without the holding thyristors B, a configuration without the memory thyristors M and the holding thyristors B, or the like, as a matter of course.

Further, although the lower wiring 200 using the stacked semiconductor layers is used for the power supply line 71 supplying the power supply potential Vga, it may be usable for the other signal lines or the like.

Furthermore, although the upper wirings 210 are configured as one layer, they may be multi-wirings having 2 layers or more.

In the present exemplary embodiment, the first p-type semiconductor layer 81, the second n-type semiconductor layer 82, the third p-type semiconductor layer 83 and the fourth n-type semiconductor layer 84 are sequentially stacked on the substrate 80 as the p-type semiconductor. However, the first p-type semiconductor layer 81 may be omitted by causing the substrate 80 that is the p-type semiconductor to also function as the first p-type semiconductor layer 81.

In addition, in the present exemplary embodiment, the anode-common thyristor is used. However, a cathode-common thyristor configured by sequentially stacking an n-type semiconductor layer, a p-type semiconductor layer, an n-type semiconductor layer and a p-type semiconductor layer on the substrate that is an n-type semiconductor may be usable if the polarity of the circuit is changed.

Note that, the usage of the light-emitting device in the present invention is not limited to an exposure device used in an electrophotographic image forming unit. The light-emitting device in the present invention may be also used in optical writing other than the electrophotographic recording, displaying, illumination, optical communication and the like.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting chip comprising:
a substrate;
a first stacked-semiconductor layer and a second stacked-semiconductor layer that each are separated by trenching at least 4 semiconductor layers stacked on the substrate, the at least 4 semiconductor layers having different conductivity types and including the substrate;
wherein a plurality of light-emitting thyristors that each have a pnpn structure are formed of the first stacked-semiconductor layer;
a lower wiring that is formed of the second stacked-semiconductor layer, the second stacked-semiconductor layer consisting of the lower 3 semiconductor layers of the at least 4 semiconductor layers and an electrode that is made of a material being in ohmic contact with an uppermost semiconductor layer of the second stacked-semiconductor layer, the electrode being provided on the uppermost semiconductor layer, a voltage having a fixed potential is applied to the semiconductor layer so that any one of p-n junctions between the substrate and the uppermost semiconductor layer is reversely biased with respect to potentials respectively applied to the substrate and the uppermost semiconductor layer; and
an upper wiring that is provided on the lower wiring so as to intersect with the lower wiring through an isolation layer, wherein the voltage having a fixed potential is applied to the semiconductor layer between the substrate and the uppermost semiconductor layer in the second stacked-semiconductor layer of the lower wiring by stacking a first metallic layer made of a material being in ohmic contact with one of the semiconductor layers having the different conductivity types and also being in direct contact with a second metallic layer made of a material being in ohmic contact with the other one of the semiconductor layers so that the first metallic layer extends to the second metallic layer.

2. The light-emitting chip according to claim 1, wherein the second stacked-semiconductor layer of the lower wiring is processed so as to have a mesa structure.

3. The light-emitting chip according to claim 1, wherein the first metallic layer and the second metallic layer are provided along a longitudinal direction of the lower wiring.

4. The light-emitting chip according to claim 1, wherein a part of the lower wiring is overlapped with the upper wiring on an opening provided in the isolation layer.

5. The light-emitting chip according to claim 1, wherein the semiconductor layers forming the first stacked-semiconductor layer and the second stacked-semiconductor layer are made of a compound semiconductor including gallium (Ga) and arsenicum (As),
the material being in ohmic contact with a semiconductor layer being p-type as a conductivity type is made of gold (Au) including zinc (Zn) (AuZn), and
the material being in ohmic contact with a semiconductor layer being n-type as a conductivity type is made of gold (Au) including germanium (Ge) (AuGe).

6. A print head comprising:
an exposure unit that exposes an image carrier, and includes a light-emitting chip; and
an optical unit that focuses light emitted by the exposure unit on the image carrier,
the light-emitting chip being provided with:
a substrate;
a first stacked-semiconductor layer and a second stacked-semiconductor layer that each are separated by trenching at least 4 semiconductor layers stacked on the substrate, the at least 4 semiconductor layers having different conductivity types and including the substrate;
wherein a plurality of light-emitting thyristors that each have a pnpn structure are formed of the first stacked-semiconductor layer,
a lower wiring that is formed of the second stacked-semiconductor layer, the second stacked-semiconductor layer consisting of the lower 3 semiconductor layers of the at least 4 semiconductor layers and an electrode that is made of a material being in ohmic contact with an uppermost semiconductor layer of the second stacked-semiconductor layer, the electrode being provided on the uppermost semiconductor layer, a voltage having a fixed potential is applied to, the semiconductor layer so that any one of p-n junctions between the substrate and the uppermost semiconductor layer is reversely biased with respect to potentials respectively applied to the substrate and the uppermost semiconductor layer; and
an upper wiring that is provided on the lower wiring so as to intersect with the lower wiring through an isolation layer, wherein the voltage having a fixed potential is applied to the semiconductor layer between the substrate and the uppermost semiconductor layer in the second stacked-semiconductor layer of the lower wiring by stacking a first metallic layer made of a material being in ohmic contact with one of the semiconductor layers having the different conductivity types and also being in direct contact with a second metallic layer made of a material being in ohmic contact with the other one of the semiconductor layers so that the first metallic layer extends to the second metallic layer.

7. An image forming apparatus comprising:
a charging unit that charges an image carrier;
an exposure unit that exposes the image carrier, and includes a light-emitting chip;
an optical unit that focuses light emitted by the exposure unit on the image carrier;
a developing unit that develops an electrostatic latent image formed on the image carrier; and
a transfer unit that transfers an image developed on the image carrier to a transferred body,
the light-emitting chip being provided with:
a substrate;
a first stacked-semiconductor layer and a second stacked-semiconductor layer that each are separated by trenching at least 4 semiconductor layers stacked on the substrate, the at least 4 semiconductor layers having different conductivity types and including the substrate;
wherein a plurality of light-emitting thyristors that each have a pnpn structure are formed of the first stacked-semiconductor layer;
a lower wiring that is formed of the second stacked-semiconductor layer, the second stacked-semiconductor layer consisting of the lower 3 semiconductor layers of the at least 4 semiconductor layers and an electrode that is made of a material being in ohmic contact with an uppermost semiconductor layer of the second stacked-semiconductor layer, the electrode being provided on the uppermost semiconductor layer, a voltage having a fixed potential is applied to the semiconductor layer so that any one of p-n junctions between the substrate and the uppermost semiconductor layer is reversely biased with respect to potentials respectively applied to the substrate and the uppermost semiconductor layer; and an upper wiring that is provided on the lower wiring so as to intersect with the lower wiring through an isolation layer, wherein the voltage having a fixed potential is applied to the semiconductor layer between the substrate and the uppermost semiconductor layer in the second stacked-semiconductor layer of the lower wiring by stacking a first metallic layer made of a material being in ohmic contact with one of the semiconductor layers having the different conductivity types and also being in direct contact with a second metallic layer made of a material being in ohmic contact with the other one of the semiconductor layers so that the first metallic layer extends to the second metallic layer.

* * * * *